United States Patent
Keum et al.

(10) Patent No.: US 11,930,593 B2
(45) Date of Patent: Mar. 12, 2024

(54) FLEXIBLE PRINTED CIRCUIT FILM AND STRETCHABLE DISPLAY DEVICE INCLUDING THE SAME

(71) Applicant: LG DISPLAY CO., LTD., Seoul (KR)

(72) Inventors: Hohyun Keum, Goyang-si (KR); Mingyu Kang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/516,926

(22) Filed: Nov. 2, 2021

(65) Prior Publication Data

US 2022/0061154 A1 Feb. 24, 2022

Related U.S. Application Data

(62) Division of application No. 16/519,291, filed on Jul. 23, 2019, now Pat. No. 11,197,370.

(30) Foreign Application Priority Data

Jul. 27, 2018 (KR) .......................... 10-2018-0087706

(51) Int. Cl.
*H05K 1/02* (2006.01)
*H01L 27/15* (2006.01)
(Continued)

(52) U.S. Cl.
CPC .......... *H05K 1/0283* (2013.01); *H01L 27/156* (2013.01); *H05K 1/0313* (2013.01);
(Continued)

(58) Field of Classification Search
CPC ...... H05K 1/0313; H05K 1/0283; H05K 1/02; H01L 27/156; H10K 77/111; H10K 59/131
(Continued)

(56) References Cited

U.S. PATENT DOCUMENTS

2011/0272181 A1 11/2011 Koo et al.
2014/0299362 A1 10/2014 Park et al.
(Continued)

FOREIGN PATENT DOCUMENTS

CN   104835416 A   8/2015
CN   105304004 A   2/2016
(Continued)

OTHER PUBLICATIONS

Chinese Office Action dated Jul. 5, 2022 issued in Patent Application No. 201910654443.5 w/English Translation (31 pages).
Korean Office Action dated Feb. 20, 2023 issued in Patent Application No. 10-2018-0087706 w/English Translation (9 pages).
Korean Notice of Allowance dated Aug. 9, 2023 issued in Patent Application No. 10-2018-0087706 w/English Translation (11 pages).

*Primary Examiner* — Tremesha S Willis
(74) *Attorney, Agent, or Firm* — POLSINELLI PC

(57) ABSTRACT

A stretchable display device comprises a display panel that includes a stretchable substrate where a plurality of emission elements is disposed, wherein the stretchable substrate is stretchable in at least one of a first direction and a second direction perpendicular to the first direction; a printed circuit film that includes a first driving circuit chip generating a drive control signal to be applied to the display panel and a second driving circuit chip receiving image data from outside and transferring the image data to the first driving circuit chip, wherein the printed circuit film is stretchable in at least one of the first direction and the second direction with respect to a stretch direction of the display panel.

11 Claims, 20 Drawing Sheets

(51) Int. Cl.
*H05K 1/03* (2006.01)
*H05K 1/14* (2006.01)
*H05K 1/18* (2006.01)
*H10K 59/131* (2023.01)
*H10K 77/10* (2023.01)
*H01L 27/12* (2006.01)
*H10K 102/00* (2023.01)

(52) U.S. Cl.
CPC ........... *H05K 1/0393* (2013.01); *H05K 1/147* (2013.01); *H05K 1/189* (2013.01); *H10K 59/131* (2023.02); *H10K 77/111* (2023.02); *H01L 27/1218* (2013.01); *H01L 27/124* (2013.01); *H05K 2201/0154* (2013.01); *H05K 2201/0162* (2013.01); *H05K 2201/10128* (2013.01); *H10K 2102/311* (2023.02)

(58) Field of Classification Search
USPC .......................................................... 257/88
See application file for complete search history.

(56) References Cited

U.S. PATENT DOCUMENTS

2015/0380355 A1  12/2015  Rogers et al.
2016/0195902 A1   7/2016  Huh et al.
2018/0182983 A1   6/2018  Bae et al.

FOREIGN PATENT DOCUMENTS

| CN | 107710885 A | 2/2018 |
| CN | 107731866 A | 2/2018 |
| KR | 10-2011-0123350 A | 11/2011 |
| KR | 2016-0013470 A | 2/2016 |
| KR | 10-2016-0085202 A | 7/2016 |
| KR | 10-1810050 B1 | 12/2017 |
| KR | 10-2018-0073742 A | 7/2018 |

(a)

(b)

(a)

(b)

FLEXIBLE PRINTED CIRCUIT FILM AND STRETCHABLE DISPLAY DEVICE INCLUDING THE SAME

CROSS-REFERENCE TO RELATED APPLICATION

This application is a divisional of U.S. patent application Ser. No. 16/519,291, filed Jul. 23, 2019, which claims the priority of Korean Patent Application No. 10-2018-0087706 filed on Jul. 27, 2018, in the Korean Intellectual Property Office, the disclosure of which is hereby incorporated by reference in its entirety.

BACKGROUND

Field of the Disclosure

The present disclosure relates to a display device, and more particularly, to a flexible printed circuit film and a stretchable display device including the same. Although the present disclosure is suitable for a wide scope of applications, it is particularly suitable for reducing stress caused by stretching of a display panel and a stretchable display device including the same.

Description of the Background

Display devices used for a computer monitor, a TV, a mobile device, etc. include an organic light-emitting display (OLED) that emits light by itself and a liquid-crystal display (LCD) that requires a separate light source.

As the display devices have been increasingly applied to diverse fields such as a computer monitor, a TV, and a mobile device, display devices having a large display area and a reduced volume and weight have been studied.

Further, recently, with the advancement of technologies related to the display devices, flexible display devices which can be folded or rolled have been studied and developed. Further, stretchable display devices which can be stretched crosswise or lengthwise are being actively studied and developed.

A typical stretchable display device includes a display panel in which elements for displaying images are disposed on an extensible resin substrate and a printed circuit board serving as a panel driver that drives the display panel. The typical stretchable display device also includes a flexible printed circuit (FPC) film that is disposed between the display panel and the printed circuit board and electrically connects the display panel and the printed circuit board.

Although the display panel of the typical stretchable display device is formed of an extensible material, the FPC film electrically connected to the display panel is formed of a non-extensible material.

SUMMARY

Accordingly, the present disclosure is to provide a flexible printed circuit film which is formed extensible according to an extensible display device, and a stretchable display device including the same.

The present disclosure is to provide a flexible printed circuit film in which damage to a driving circuit chip or and lines disposed on the flexible printed circuit film can be minimized even when the flexible printed circuit film is formed of an extensible material, and a stretchable display device including the same.

The present disclosure is to provide a flexible printed circuit film which can be bonded to a display panel under conventional processing conditions even when the flexible printed circuit film is formed of an extensible material, and a stretchable display device including the same.

The present disclosure is not limited to the above-mentioned aspects and other aspects which are not mentioned above, can be clearly understood by those skilled in the art from the following descriptions.

According to an aspect of the present disclosure, a flexible printed circuit film, comprises a base film; and a plurality of conductive lines disposed on a surface of the base film, wherein the base film is disposed to correspond to the plurality of conductive lines. Therefore, the flexible printed circuit film according to an aspect of the present disclosure can reduce stress which is concentrated on a predetermined region when a stretchable module is extended. Thus, it is possible to minimize damage to the flexible printed circuit film.

According to another aspect of the present disclosure, a stretchable display device, comprises a display panel that has a stretchable substrate where a plurality of emission elements is disposed; a printed circuit board that receives image data from outside and transfers the image data to the display panel; and a connection film that includes a plurality of conductive lines electrically connecting the display panel and the printed circuit board, wherein the connection film further includes a plurality of sub-base films to correspond to the plurality of conductive lines in accordance with a stretch rate of the display panel. Therefore, the stretchable display device according to another aspect of the present disclosure can reduce stress which is applied to the connection film when the display panel is stretched.

According to yet another aspect of the present disclosure, a flexible printed circuit film, comprises a base film which is stretchable in at least one of a first direction and a second direction perpendicular to the first direction; a plurality of rigid substrates disposed on at least one of a top surface or a bottom surface of the base film; a driving circuit chip disposed on one of the plurality of rigid substrates; and a plurality of conductive lines that transfers data input from outside. In the flexible printed circuit film according to yet another aspect of the present disclosure, the base film is extensible, but a rigid part is disposed where the driving circuit chip is disposed. Thus, even when the ductile circuit board is extended and contracted, damage to the driving circuit chip can be minimized.

According to yet another aspect of the present disclosure, a stretchable display device comprises a display panel that includes a stretchable substrate where a plurality of emission elements is disposed, wherein the stretchable substrate is stretchable in at least one of a first direction and a second direction perpendicular to the first direction; a printed circuit board that receives image data from outside and transfers the image data to the display panel; and a connection film electrically connecting the display panel and the printed circuit board, wherein the connection film is stretchable in at least one of the first direction and the second direction with respect to a stretch direction of the display panel.

According to still another aspect of the present disclosure, a stretchable display device comprises a display panel that includes a stretchable substrate where a plurality of emission elements is disposed, wherein the stretchable substrate is stretchable in at least one of a first direction and a second direction perpendicular to the first direction; a printed circuit film that includes a first driving circuit chip generating a drive control signal to be applied to the display panel and a second driving circuit chip receiving image data from outside and transferring the image data to the first driving circuit chip, wherein the printed circuit film is stretchable in at least one of the first direction and the second direction with respect to a stretch direction of the display panel.

Therefore, in the stretchable display device according to the present disclosure, the ductile film is formed extensible according to the extensible display panel. Thus, the stretchable display device according to the present disclosure can be improved in extensibility, compared to conventional stretchable display devices.

Other detailed matters of the exemplary aspects are included in the detailed description and the drawings.

According to the present disclosure, a display panel is formed of an extensible material, and, thus, a stretchable display device can be easily bent or stretched.

According to the present disclosure, a plurality of relatively rigid island substrates is disposed on a ductile substrate as spaced apart from each other at a predetermined distance. Further, an emission element and a driving element are disposed on each of the island substrates. Thus, even when the stretchable display device is stretched, a reduction in reliability can be minimized.

According to the present disclosure, as the display panel is stretched, a base part of a flexible printed circuit film is separated according to lines disposed on the flexible printed circuit film. Therefore, even if the flexible printed circuit film is not formed of an extensible material, it is possible to minimize stress which is applied to the flexible printed circuit film when the display panel is stretched.

According to the present disclosure, the flexible printed circuit film is formed of an extensible material. Thus, the stretchable display device can have further improved extensibility.

According to the present disclosure, a base film of the flexible printed circuit film is formed of a ductile material and a rigid film is further disposed on the base film where a driving circuit chip is disposed. Thus, even when the flexible printed circuit film is stretched, it is possible to suppress damage to the driving circuit chip.

According to the present disclosure, the base film of the flexible printed circuit film is formed of a ductile material and a rigid substrate is further disposed where the flexible printed circuit film is bonded to the display panel. Thus, the flexible printed circuit film can be bonded to the display panel under conventional bonding processing conditions.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
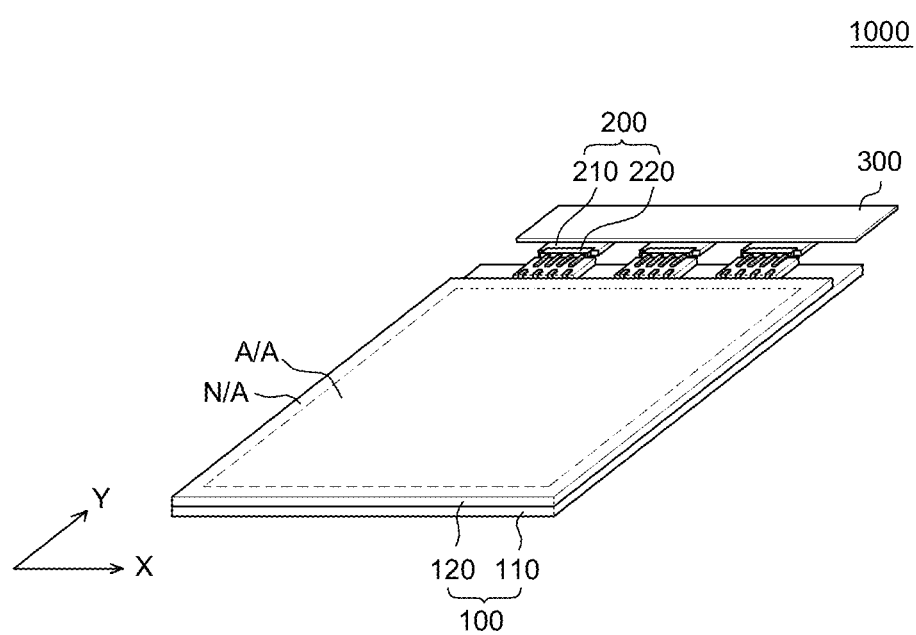
FIG. 1A and FIG. 1B show a perspective view and an exploded perspective view of a stretchable display device according to the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a stretchable display device according to exemplary aspects of the present disclosure will be described in detail with reference to accompanying drawings.

A stretchable display device may refer to a display device which can display images even it is bent or stretched. The stretchable display device may have higher flexibility than typical display devices. Thus, the stretchable display device can be freely changed in shape by a user's manipulation such as bending or stretching of the stretchable display device. For example, when the user seizes an end of the stretchable display device and pulls the stretchable display device, the stretchable display device can be stretched by force of the user. If the user places the stretchable display device on an uneven wall surface, the stretchable display device can be bent according to the shape of the wall surface. When the force applied by the user is removed, the stretchable display device can return to its original shape.

Figure 1B:
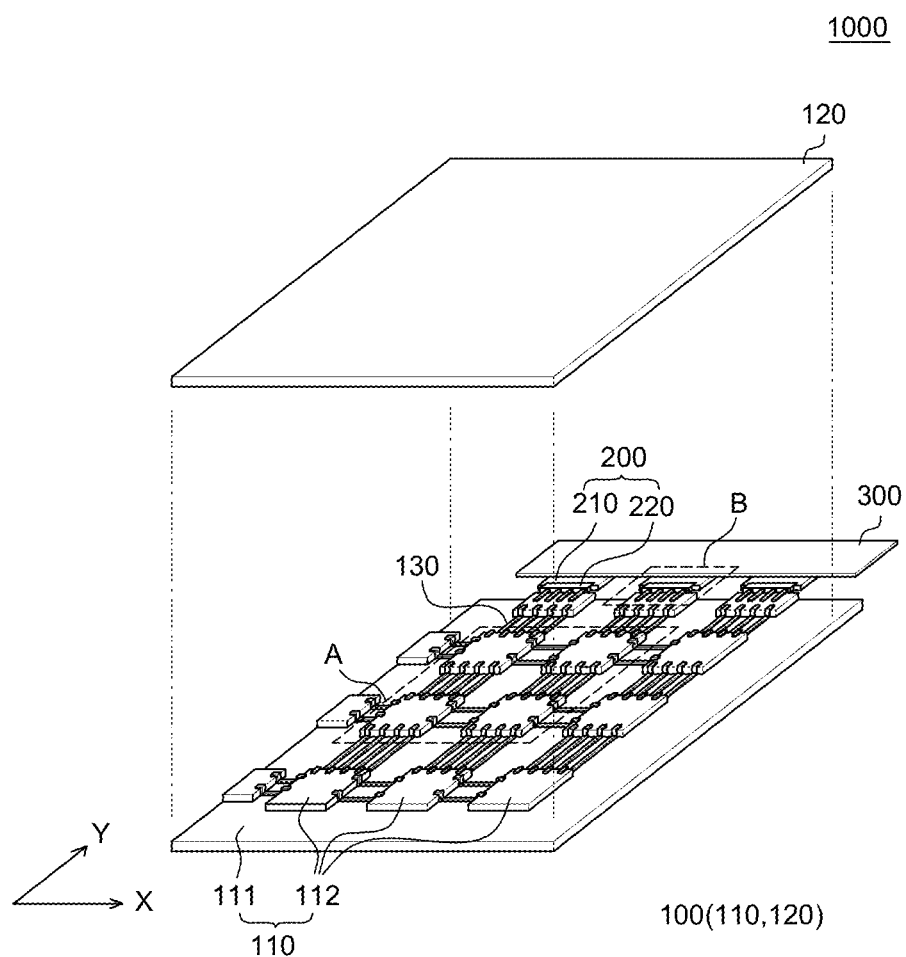

FIG. 1A and FIG. 1B show a perspective view and an exploded perspective view of a stretchable display device according to an aspect of the present disclosure.

Referring to FIG. 1A and FIG. 1B, a stretchable display device 1000 according to an aspect of the present disclosure includes a display panel 100, a flexible printed circuit film 200, and a printed circuit board 300.

The display panel 100 may be extensible in one of a first direction X and a second direction Y, or may be two-dimensionally extensible in the first direction X and the second direction Y Herein, the first direction X and the second direction Y define a plane of the stretchable display device 1000. The second direction Y may be perpendicular to the first direction X.

The display panel 100 includes a first substrate 110 serving as a bottom substrate and a second substrate 120 serving as an top substrate. Although not illustrated in FIG. 1, the display panel 100 may further include a polarizing plate disposed under the first substrate 110 or above the second substrate 120.

The first substrate 110 serves to protect and support various components of the display panel 100. The first substrate 110 may include a lower substrate 111 which is formed of a ductile material and thus can be bent or stretched. The first substrate 110 may also include an upper substrate 112 of the first substrate 110 which is disposed on the lower substrate 111 and formed of a rigid material compared to the upper substrate 112. Herein, the upper substrate 112 of the first substrate 110 is not disposed on the entire surface of the lower substrate 111 of the first substrate 110. Instead, the upper substrate 112 may include a plurality of upper substrates 112 disposed like islands spaced apart from each other. A detailed structure of the first substrate 110 will be described later with reference to FIG. 2.

The second substrate 120 is disposed to overlap the first substrate 110 and serves to protect various components of the display panel 100. The second substrate 120 may include a ductile substrate and may be formed of an insulating material which can be bent or stretched. For example, the second substrate 120 may be formed of an extensible material and may be formed of the same material as the first substrate 110 but is not limited thereto.

The display panel 100 includes an active area A/A where an image is displayed, and a non-active area N/A formed to surround the active area A/A in an area adjacent to the active area A/A.

The active area A/A includes a plurality of pixels including a plurality of sub-pixels. Each of the plurality of sub-pixels includes an emission element and may be connected to various lines such as a gate line, a data line, a high-potential power line, a low-potential power line, a reference voltage line, etc.

The non-active area N/A refers to an area which is formed around the active area A/A and on which an image is not displayed. In the non-active area N/A, lines extended from the active area A/A and circuits may be disposed. For example, a plurality of bonding pads or signal pads may be disposed in the non-active area N/A, and the pads may be connected respectively to the plurality of sub-pixels disposed in the active area A/A.

In each of the active area A/A and the non-active area N/A, a first region and a second region having different modulus may be defined. In the active area A/A, the first region refers to a region where a plurality of pixels is disposed, and the second region refers to a region where lines electrically connecting the pixels are placed. Further, in the non-active area N/A, the first region refers to a region where bonding pads electrically connected to the flexible printed circuit film 200 or circuits or signal pads configured to apply driving signals to the respective pixels are placed. In the non-active area N/A, the second region refers to a region where lines extended from the active area A/A are disposed. As will be described later, the first regions may refer to regions where the island substrates are disposed, and the second regions may refer to regions where the island substrates are not disposed. A detailed structure of the display panel 100 will be described later with reference to FIG. 2 and FIG. 3.

The flexible printed circuit film 200 transfers a signal input from the printed circuit board 300 to the display panel 100. That is, the flexible printed circuit film 200 may serve as a connection film disposed between the display panel 100 and the printed circuit board 300 and electrically connecting the display panel 100 and the printed circuit board 300. The flexible printed circuit film 200 may be bonded to a plurality of bonding pads disposed in the non-active area N/A. The flexible printed circuit film 200 may supply power voltage, data voltage, gate voltage, etc. through the plurality of bonding pads to the respective sub-pixels disposed in the active area A/A.

The flexible printed circuit film 200 includes a base film 210, a driving circuit chip 220 disposed on the base film 210, and a plurality of conductive lines (not illustrated) disposed on the base film 210 and transferring drive signals or control signals.

The base film 210 serves to support the driving circuit chip 220. The base film 210 may be formed of an insulating material having flexibility and may be formed of, e.g., polyimide (PI)-based resin or epoxy-based resin.

The driving circuit chip 220 processes data for displaying an image input from the outside and a drive signal for processing the data. FIG. 1A and FIG. 1B illustrate that the driving circuit chip 220 is mounted by a chip on film (COF) method, but is not limited thereto. The driving circuit chip 220 may also be mounted by a chip on glass (COG) method or a tape carrier package (TCP) method.

Although not illustrated in FIG. 1A and FIG. 1B, the flexible printed circuit film 200 further includes a plurality of conductive lines disposed on at least one surface of the base film 210. The plurality of conductive lines transfers image data and drive data input from the printed circuit board 300 to the driving circuit chip 220. Further, the plurality of conductive lines transfers a data signal and a drive control signal output from the driving circuit chip 220 to the display panel 100.

In the flexible printed circuit film 200 according to an aspect of the present disclosure, the base film 210 may be disposed as separated from each other in order for a part of the base film 210 to respond to the extensible display panel 100. More specifically, the base film 210 of the flexible printed circuit film 200 may be separated into sub-base films respectively corresponding to the plurality of conductive lines disposed on the base film 210. The flexible printed circuit film 200 will be described in more detail with reference to FIG. 5A through FIG. 7B.

In the printed circuit board 300, a control unit such as a driving chip, a circuit, etc. for controlling driving of circuits disposed in the display panel 100 and the driving circuit chip 220 disposed in the flexible printed circuit film 200 may be disposed. The printed circuit board 300 receives image data and drive data from the outside and outputs the data to the flexible printed circuit film 200. The flexible printed circuit film 200 converts the image data and the drive data into a data signal and a drive control signal and outputs the signals to the display panel 100. Further, a memory, a processor, and the like may be provided in the printed circuit board 300.

In the stretchable display device 1000 according to an aspect of the present disclosure, the base film 210 of the flexible printed circuit film 200 is separated into multiple films so as to respectively correspond to the plurality of conductive lines disposed on the base film 210. Thus, when the display panel 100 is stretched, the flexible printed circuit film 200 is changed in shape accordingly. Therefore, stress of the flexible printed circuit film 200 can be minimized when the display panel 100 is stretched.

Hereafter, the stretchable display device 1000 according to an aspect of the present disclosure will be described in more detail. First, the structure of the stretchable display panel 100 included in the stretchable display device 1000 will be described in more detail.

Figure 2:
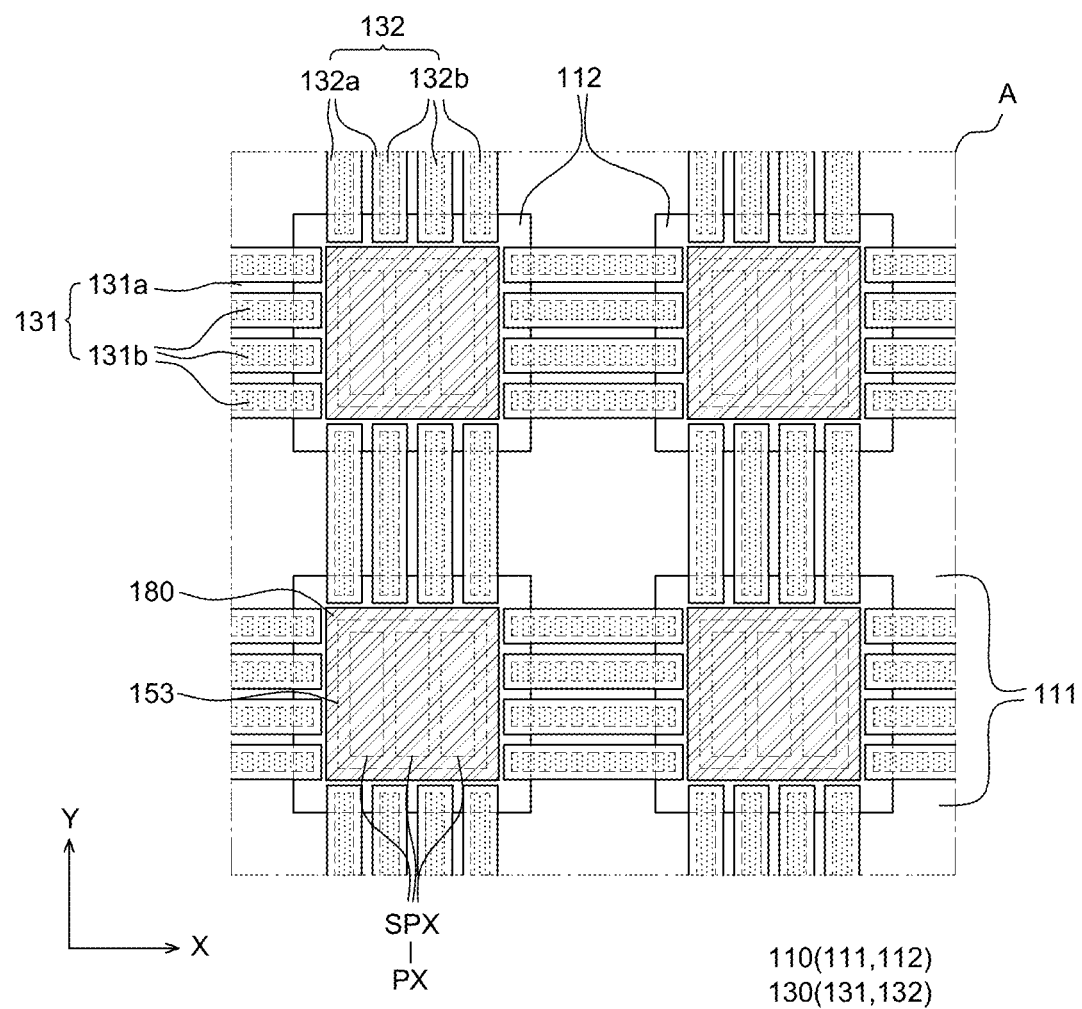
FIG. 2 is an enlarged plan view illustrating a region "A" of FIG. 1B.

FIG. 2 is an enlarged plan view illustrating a region "A" of FIG. 1B.

Referring to FIG. 2, the first substrate 110 of the stretchable display device 1000 according to an aspect of the present disclosure may include a lower substrate 111, a plurality of island substrates 112, and connection lines 130.

The lower substrate 111 serves to support and protect various components of the stretchable display device 1000. The lower substrate 111 may include a ductile substrate and may be formed of an insulating material which can be bent or stretched. For example, the lower substrate 111 may be formed of silicone rubber such as polydimethylsiloxane (PDMS) and an elastomer such as polyurethane (PU). However, the materials of the lower substrate 111 are not limited thereto.

The lower substrate 111 may have a modulus ranging from several MPa to several hundreds of MPa and may have a stretch failure of 100% or more. The thickness of the lower substrate 111 may be from 10 μm to 1 mm, but is not limited thereto.

The plurality of island substrates 112 is disposed on the lower substrate 111. The plurality of island substrates 112 may include rigid substrates unlike the lower substrate 111, and is disposed to space apart from each other on the lower substrate 111. More specifically, the plurality of island substrates 112 is less extensible and more rigid than the lower substrate 111. A modulus of the plurality of island substrates 112 may be 1000 times or more than that of the lower substrate 111, but is not limited thereto. The plurality of island substrates 112 may be formed of a plastic material having flexibility and may be formed of, e.g., PI-based resin or epoxy-based resin.

As described above, the lower substrate 111 and the plurality of island substrates 112 may have different rigidities and thus may have different modulus. Therefore, the first substrate 110 of the stretchable display device 1000 according to an aspect of the present disclosure may include a first region 110A and a second region 110B having different modulus.

More specifically, the first region 110A may refer to a region where the island substrate 112 is disposed, and the second region 110B may refer to a region where the island substrate 112 is not disposed. The first region 110A may have a higher modulus than the second region 110B. Herein, the modulus refers to an elastic modulus that is the ratio of the stress applied to a substrate to the change caused by the stress. If the modulus is relatively high, the rigidity may be relatively high. Therefore, the first region 110A may be a rigid region having a higher rigidity than the second region 110B. Accordingly, in the first region 110A, i.e., in each of the plurality of island substrates 112, a pixel PX including a plurality of sub-pixels SPX for displaying an image may be disposed. The structure of each sub-pixel SPX will be described in detail with reference to FIG. 3.

Between the plurality of island substrates 112, i.e., in the second region 110B, the connection lines 130 are disposed. The connection lines 130 are disposed between the pads on the plurality of island substrates 112 to electrically connect the pads.

The connection lines 130 may include a first connection line 131 and a second connection line 132. The first connection line 131 refers to a line disposed in an X-axis direction on the display panel 110, and the second connection line 132 refers to a line disposed in a Y-axis direction on the display panel 100. FIG. 2 illustrates the connection lines 130 as straight lines, but the present disclosure is not limited thereto. The connection lines 130 may be disposed in a wave shape or a diamond shape to suppress damage to the connection lines 130 when the display panel 100 is stretched.

In a typical OLED, various lines such as a plurality of gate lines, a plurality of data lines, etc. may be disposed as extended between a plurality of sub-pixels and each signal line is connected to a plurality of sub-pixels. Therefore, in the typical OLED, various lines such as a gate line, a data line, a high-potential power line, a reference voltage line, etc. are seamlessly extended on a substrate from one side to the other side of the OLED.

In the stretchable display device 1000 according to an aspect of the present disclosure, various lines, such as a gate line, a data line, a high-potential power line, and a reference voltage line, formed of a metal material are disposed only on the plurality of island substrates 112. That is, in the stretchable display device 1000 according to an aspect of the present disclosure, the various lines formed of a metal material may be disposed only on the plurality of island substrates 112 and may not be formed in contact with the lower substrate 111. Thus, the various lines may be patterned corresponding to the plurality of island substrates 112 and disposed in a discontinuous manner.

In the stretchable display device 1000 according to an aspect of the present disclosure, pads on two adjacent island substrates 112 may be connected by the connection line 130 to connect discontinuous lines. That is, the connection line 130 electrically connects the pads on the two adjacent island substrates 112. For example, a gate line may be disposed in each of the plurality of island substrates 112 disposed adjacent to each other in the X-axis direction. Further, gate pads may be disposed at both ends of the gate line on each island substrate 112. Herein, a plurality of gate pads may be electrically connected by a connection line 130 disposed between one island substrate 112 and another island substrate 112 adjacent thereto. In this case, the connection line 130 extended in the X-axis direction may serve as a gate line that transfers a gate signal. That is, referring to FIG. 2, the first connection line 131 may serve as a gate line, but is not limited thereto. The first connection line 131 may also serve as a low-potential power line.

The second connection line 132 may connect pads on two adjacent island substrates 112 among pads on the plurality of island substrates 112 disposed adjacent to each other in the Y-axis direction. The second connection line 132 may serve as a data line, a high-potential power line, or a reference voltage line, but is not limited thereto.

The connection lines 130 may include, e.g., base polymers 131*a* and 132*a* and conductive particles 131*b* and 132*b* dispersed in the base polymers 131*a* and 132*a*. In this case, the base polymers 131*a* and 132*a* are located to overlap the conductive particles 131*b* and 132*b*. The base polymers 131*a* and 132*a* may be disposed to separate from each other corresponding to respective conductive paths. FIG. 2 illustrates that the base polymers 131*a* and 132*a* are disposed to separate from each other corresponding to the conductive paths, but the present disclosure is not limited thereto. A plurality of conductive paths may be disposed on each of the base polymers 131*a* and 132*a*.

Similar to the lower substrate 111, the base polymers 131*a* and 132*a* may be formed of an insulating material which can be bent or stretched. The base polymers 131*a* and 132*a* may include, e.g., styrene butadiene styrene (SBS) or the like, but are not limited thereto. Therefore, the connection lines 130 can minimize the occurrence of cracks in the connection lines 130 when the lower substrate 111 is bent, extended or contracted.

The base polymers 131*a* and 132*a* may be in contact with connection pads on the most adjacent island substrate 112 among the plurality of island substrates 112. The connection pads are in contact with upper and lateral surfaces of a bank on the island substrate 112 and lateral surfaces of an overcoating layer, an interlayer insulating layer, a buffer layer, and the plurality of island substrates 112 and extended to a top surface of the lower substrate 111. Thus, the base polymers 131*a* and 132*a* may be in contact with lateral surfaces of a buffer layer, a gate insulating layer, an interlayer insulating layer, an overcoating layer, and a bank on the island substrate 112 in contact with the top surface of the lower substrate 111 and a lateral surface of the adjacent island substrate 112. The base polymers 131*a* and 132*a* may be in contact with connection pads disposed on the adjacent island substrates 112.

The conductive particles 131*b* and 132*b* are disposed to be dispersed in the base polymers 131*a* and 132*a* and form conductive paths electrically connecting connection pads disposed on the adjacent island substrates 112, respectively. Further, the conductive particles 131*b* and 132*b* may electrically connect a gate pad on the outermost island substrate 112 in the active area A/A among the plurality of island substrates 112 and a gate signal pad in the non-active area N/A to form a conductive path.

Meanwhile, FIG. 1B and FIG. 2 illustrate the connection lines 130 as extended in straight lines, but the present disclosure is not limited thereto. The connection lines 130 need to be disposed in the second region 110B to be extended and contracted when the lower substrate 111 is extended and contracted. Therefore, the connection lines 130 may be disposed in a wave shape or a diamond shape. In an aspect of the present disclosure, the connection lines 130 are described as disposed in a wave shape or a diamond shape, but the present disclosure is not limited thereto. The connection lines 130 may be disposed in any shape capable of minimizing the occurrence of cracks even when extended or contracted. Therefore, the connection lines 130 can minimize the occurrence of cracks in the connection lines 130 when the lower substrate 111 is bent, extended or contracted.

In general, a stretchable display device needs to be easily bent or stretched. There have been attempts to use a ductile substrate having a low modulus. A ductile material having a low modulus, such as PDMS, is used for a display element, i.e., a lower substrate on which pixels are disposed. However, since the material having a low modulus is vulnerable to heat, the substrate may be damaged by heat of a high temperature, e.g., 100° C. or higher, generated during a process of forming the transistor and the display element.

Therefore, pixels need to be formed on a substrate formed of a heat-resisting material in order to avoid damage to the substrate during a process of forming the pixels. Thus, there have been attempts to use a heat-resisting material such as PI to form the substrate. However, the heat-resisting material has a high modulus and thus are not ductile. Therefore, when the stretchable display device is stretched, it is difficult for the substrate to be bent or stretched.

Therefore, in the stretchable display device 1000 according to an aspect of the present disclosure, the plurality of island substrates 112 serving as rigid substrates is disposed only in regions where pixels including transistors or organic light emitting elements are disposed. Thus, during a process of forming the pixels, damage to the plurality of island substrates 112 caused by heat of high temperature can be suppressed.

Further, in the stretchable display device 1000 according to an aspect of the present disclosure, the lower substrate 111 serving as a ductile substrate may be disposed under the plurality of island substrates 112. Thus, the lower substrate 111 except the regions overlapping the plurality of island substrates 112 can be easily stretched or bent, so that the stretchable display device 1000 can be implemented. Further, when the stretchable display device 1000 is bent or stretched, it is possible to suppress damage to the transistors, the organic light emitting elements, etc. disposed on the plurality of island substrates 112 serving as rigid substrates.

Hereafter, the structure of a sub-pixel SPX of the stretchable display device 1000 according to an aspect of the present disclosure will be described in more detail.

Figure 3:
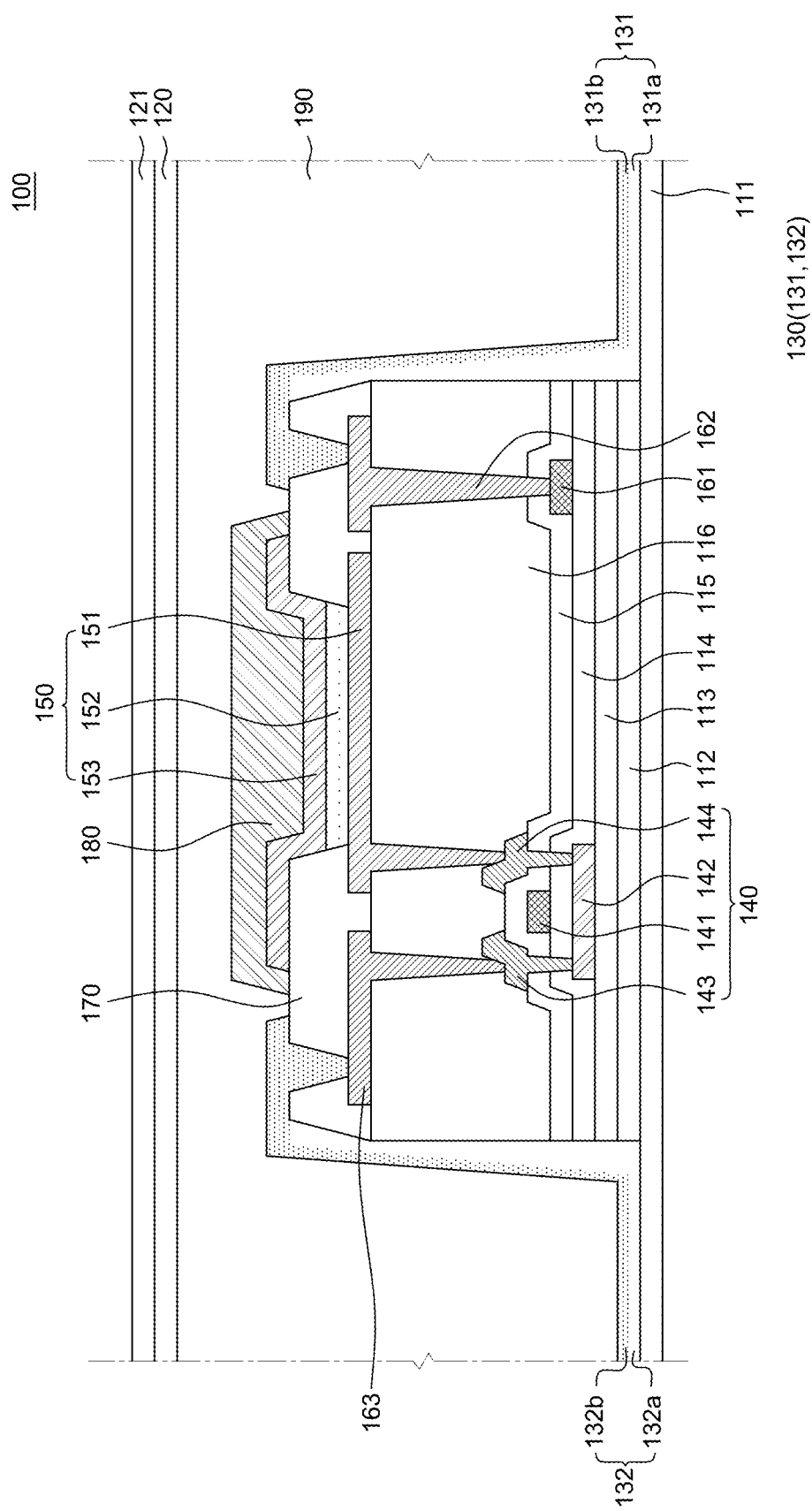
FIG. 3 is a schematic cross-sectional view of a sub-pixel according to an aspect of FIG. 2.

FIG. 3 is a schematic cross-sectional view of a sub-pixel according to an aspect of FIG. 2.

Referring to FIG. 3, on the plurality of island substrates 112 according to an aspect of the present disclosure, a buffer layer 113 is disposed. The buffer layer 113 is disposed on the plurality of island substrates 112 to protect various components of the stretchable display device 1000 against permeation of moisture and oxygen from the outside. The buffer layer 113 may be formed of an insulating material. The buffer layer 113 may include a single inorganic layer or multiple inorganic layers formed of, e.g., silicon nitride (SiNx), silicon oxide (SiOx), or silicon oxynitride (SiON). The buffer layer 113 may not be provided depending on the structure or characteristics of the stretchable display device 1000.

Herein, the buffer layer 113 may be formed only in the regions overlapping the plurality of island substrates 112. As described above, the buffer layer 113 may be formed of an inorganic material. Thus, while the stretchable display device 1000 is stretched, the buffer layer 113 may be easily damaged such as cracked. Therefore, the buffer layer 113 is not formed in the regions between the plurality of island substrates 112, but patterned similar to the shape of the plurality of island substrates 112 and formed only on the plurality of island substrates 112. In the stretchable display device 1000 according to an aspect of the present disclosure, the buffer layer 113 is formed only in the regions overlapping the plurality of island substrates 112 serving as rigid substrates. Thus, even when the stretchable display device 1000 is changed in shape by bending or stretching, it is possible to suppress damage to the buffer layer 113.

Referring to FIG. 3, a transistor 140 including a gate electrode 141, an active layer 142, a source electrode 143, and a drain electrode 144 is formed on the buffer layer 113. For example, during a process of forming the transistor 140, the active layer 142 is formed on the buffer layer 113 and a gate insulating layer 114 for insulating the active layer 142 from the gate electrode 141 is formed on the active layer 142. An interlayer insulating layer 115 for insulating the gate electrode 141 from the source electrode 143 and the drain electrode 144 is formed. The source electrode 143 and the drain electrode 144 in contact with the active layer 142 are formed on the interlayer insulating layer 115, respectively.

The gate insulating layer 114 and the interlayer insulating layer 115 may be patterned and formed only in the regions overlapping the plurality of island substrates 112. Similar to the buffer layer 113, the gate insulating layer 114 and the interlayer insulating layer 115 may be formed of an inorganic material and thus may be easily damaged such as cracked while the stretchable display device 1000 is stretched. Therefore, the gate insulating layer 114 and the interlayer insulating layer 115 are not formed in the regions between the plurality of island substrates 112, i.e., in the second region 110B. Instead, the gate insulating layer 114 and the interlayer insulating layer 115 are patterned similar to the shape of the plurality of island substrates 112 and formed only on the plurality of island substrates 112.

FIG. 3 illustrates only a driving transistor among various transistors which can be included in the stretchable display device 1000, for the convenience of description. However, a switching transistor, a capacitor, and the like may also be included in the display device. Further, the transistor 140 of the present disclosure has been described as having a coplanar structure, but is not limited thereto, and various transistors having a staggered structure and the like may also be used.

Referring to FIG. 3, a gate pad 161 is disposed on the gate insulating layer 114. The gate pad 161 serves to transfer a gate signal to a plurality of sub-pixels SPX. The gate pad 161 may be formed of the same material as the gate electrode 141 but is not limited thereto.

Referring to FIG. 3, an overcoating layer 116 is formed on the transistor 140 and the interlayer insulating layer 115. The overcoating layer 116 serves to flatten an upper part of the transistor 140. The overcoating layer 116 may be formed as a single layer or multiple layers and may be formed of an organic material. For example, the overcoating layer 116 may be an acryl-based organic material but is not limited thereto. The overcoating layer 116 may include a contact hole for electrically connecting the transistor 140 and an anode 151 and a contact hole for electrically connecting a data pad 163 and the source electrode 143. The overcoating layer 116 may also include a contact hole for electrically connecting a connection pad 162 and the gate pad 161.

In some aspects, a passivation layer may be formed between the transistor 140 and the overcoating layer 116. That is, the passivation layer covering the transistor 140 may be formed to protect the transistor 140 against permeation of moisture and oxygen. The passivation layer may be formed of an inorganic material and may be formed as a single layer or multiple layers but is not limited thereto.

Referring to FIG. 3, the data pad 163, the connection pad 162, and an organic light emitting element 150 are disposed on the overcoating layer 116.

The data pad 163 may transfer a data signal from the connection line 130 serving as a data line to the plurality of sub-pixels SPX. The data pad 163 is connected to the source electrode 143 of the transistor 140 through the contact hole formed in the overcoating layer 116. The data pad 163 may be formed of the same material as the anode 151 of the organic light emitting element 150 but is not limited thereto. Further, the data pad 163 may be formed, not on the overcoating layer 116, but on the interlayer insulating layer 115 and may be formed of the same material as the source electrode 143 and the drain electrode 144 of the transistor 140.

The connection pad 162 may transfer a gate signal from the connection line 130 serving as a gate line to the plurality of sub-pixels SPX. The connection pad 162 is connected to the gate pad 161 through the contact holes formed in the overcoating layer 116. The connection pad 162 may be formed of the same material as the data pad 163 but is not limited thereto.

The organic light emitting element 150 is disposed corresponding to each of the plurality of sub-pixels SPX and configured to emit light having a specific wavelength range. That is, the organic light emitting element 150 may be a blue organic light emitting element that emits blue light, a red organic light emitting element that emits red light, a green organic light emitting element that emits green light, or a white organic light emitting element that emits white light. However, the present disclosure is not limited thereto. If the organic light emitting element 150 is a white organic light emitting element, the stretchable display device 1000 may further include a color filter.

The organic light emitting element 150 includes the anode 151, an organic light emitting layer 152, and a cathode 153. Specifically, the anode 151 is disposed on the overcoating layer 116. The anode 151 is an electrode configured to supply holes into the organic light emitting layer 152. The anode 151 may be formed of a transparent conductive material having a high work function. Herein, the transparent conductive material may include indium tin oxide (ITO), indium zinc oxide (IZO), and indium tin zinc oxide (ITZO). The anode 151 may be formed of the same material as the data pad 163 and the gate pad 161 disposed on the overcoating layer 116 but is not limited thereto. If the stretchable display device 1000 is of top-emission type, the anode 151 may further include a reflective plate.

The anode 151 is disposed as separated for each sub-pixel SPX and electrically connected to the transistor 140 through the contact hole formed in the overcoating layer 116. For example, FIG. 3 illustrates that the anode 151 is electrically connected to the drain electrode 144 of the transistor 140, but the anode 151 may be electrically connected to the source electrode 143.

A bank 170 is formed on the anode 151, the data pad 163, the connection pad 162, and the overcoating layer 116. The bank 170 separates adjacent sub-pixels SPX. The bank 170 is disposed to cover at least a part of both sides of the adjacent anode 151 and exposes a part of atop surface of the anode 151. The bank 170 may serve to suppress light emission of unintended sub-pixels SPX or color mixing which occurs when light is emitted from the sides of the anode 151 due to concentration of current on the edges of the anode 151. The bank 170 may be formed of acryl-based resin, benzocyclobutene (BCB)-based resin, or PI, but is not limited thereto.

The bank 170 includes a contact hole for connecting the connection line 130 serving as a data line and the data pad 163 and a contact hole for connecting the connection line 130 serving as a gate line and the connection pad 162.

The organic light emitting layer 152 is disposed on the anode 151. The organic light emitting layer 152 is configured to emit light. The organic light emitting layer 152 may contain a light-emitting material, and the light-emitting material may include a phosphorescent material or a fluorescent material but is not limited thereto.

The organic light emitting layer 152 may be formed of a single emission layer. Otherwise, the organic light emitting layer 152 may have a stack structure in which a plurality of emission layers with a charge generation layer interposed therebetween is laminated. Further, the organic light emitting layer 152 may further include at least one organic layer of a hole transporting layer, an electron transporting layer, a hole blocking layer, an electron blocking layer, a hole injection layer, and an electron injection layer.

Referring to FIG. 3, the cathode 153 is disposed on the organic light emitting layer 152. The cathode 153 is configured to supply electrons into the organic light emitting layer 152. The cathode 153 may be formed of a transparent conductive oxide such as ITO, IZO, ITZO, zinc oxide (ZnO), and tin oxide (TO) or an ytterbium (Yb) alloy. Otherwise, the cathode 153 may be formed of a metal material.

The cathode 153 may be patterned to overlap each of the plurality of island substrates 112. That is, the cathode 153 may be formed only in the regions overlapping the plurality of island substrates 112 and may not be formed in the regions between the plurality of island substrates 112. The cathode 153 is formed of a transparent conductive oxide, a metal material, and the like. Thus, if the cathode 153 is formed between the plurality of island substrates 112, the cathode 153 may be damaged while the stretchable display device 1000 is expanded and contracted. Thus, the cathode 153 may be formed on the plane so as to correspond to each of the plurality of island substrates 112. The cathode 153 may be formed in the regions overlapping the plurality of island substrates 112 so as not to overlap the connection line 130.

Unlike the typical OLED, the stretchable display device 1000 according to an aspect of the present disclosure includes the cathodes 153 patterned corresponding to the plurality of island substrates 112. Therefore, the cathodes 153 respectively disposed on the plurality of island substrates 112 can be independently supplied with low-potential power through the connection lines 130.

Referring to FIG. 3, an encapsulation layer 180 is disposed on the organic light emitting element 150. The encapsulation layer 180 covers the organic light emitting element 150 to be in contact with a part of a top surface of the bank 170 and thus seals the organic light emitting element 150. Thus, the encapsulation layer 180 protects the organic light emitting element 150 against permeation of moisture or air from the outside or physical impacts.

The encapsulation layer 180 covers the cathodes 153 patterned to overlap the plurality of island substrates 112, respectively, and may be formed for each of the plurality of island substrates 112. That is, the encapsulation layer 180 may be disposed to cover a single cathode 153 disposed on a single island substrate 112, and the encapsulation layers 180 disposed on the respective island substrates 112 may be spaced apart from each other.

The encapsulation layer 180 may be formed only in the regions overlapping the plurality of island substrates 112. As described above, the encapsulation layer 180 may be configured including an inorganic layer. Therefore, the encapsulation layer 180 may be easily damaged such as cracked while the stretchable display device 1000 is stretched. Particularly, since the organic light emitting element 150 is vulnerable to moisture or oxygen, if the encapsulation layer 180 is damaged, the reliability of the organic light emitting element 150 may be decreased. Therefore, in the stretchable display device 1000 according to an aspect of the present disclosure, the encapsulation layer 180 is not formed in the regions between the plurality of island substrates 112. Thus, even when the stretchable display device 1000 is changed in shape by bending or stretching, it is possible to minimize damage to the encapsulation layer 180.

The stretchable display device 1000 according to an aspect of the present disclosure can be compared with a conventional flexible OLED. In the stretchable display device 1000, the plurality of island substrates 112 which is relatively rigid is disposed on the lower substrate 111 which is relatively ductile. Further, the cathode 153 and the encapsulation layer 180 of the stretchable display device 1000 are patterned and disposed corresponding to each of the plurality of island substrates 112. That is, the stretchable display device 1000 according to an aspect of the present disclosure is configured to be easily changed in shape when the user stretches or bends the stretchable display device 1000. While the stretchable display device 1000 is changed in shape, damage to the components of the stretchable display device 1000 can be minimized.

Referring to FIG. 3, an adhesive layer 190, the second substrate 120, and a polarizing plate 121 are disposed on the first substrate 110 on which the encapsulation layer 180 is disposed.

The second substrate 120 serves to support various components disposed under the second substrate 120. The second substrate 120 may be bonded to the first substrate 110 by the adhesive layer 190.

The polarizing plate 121 is disposed on the second substrate 120. The polarizing plate 121 may polarize light incident from the outside of the stretchable display device 1000. The polarized light incident into the stretchable display device 1000 through the polarizing plate 121 may be reflected within the stretchable display device 1000 and its phase can be shifted. Apart of the phase-shifted light may not pass through the polarizing plate 121. Thus, the light incident into the stretchable display device 1000 from the outside of the stretchable display device 1000 cannot be released to the outside of the stretchable display device 1000. Therefore, external light reflection of the stretchable display device 1000 can be reduced.

FIG. 3 illustrates the emission element as an organic light emitting element, but the emission element of the stretchable display device 1000 may be a micro LED. Hereafter, the structure of a sub-pixel of the stretchable display device 1000 including a micro LED as the emission element will be described.

Figure 4:
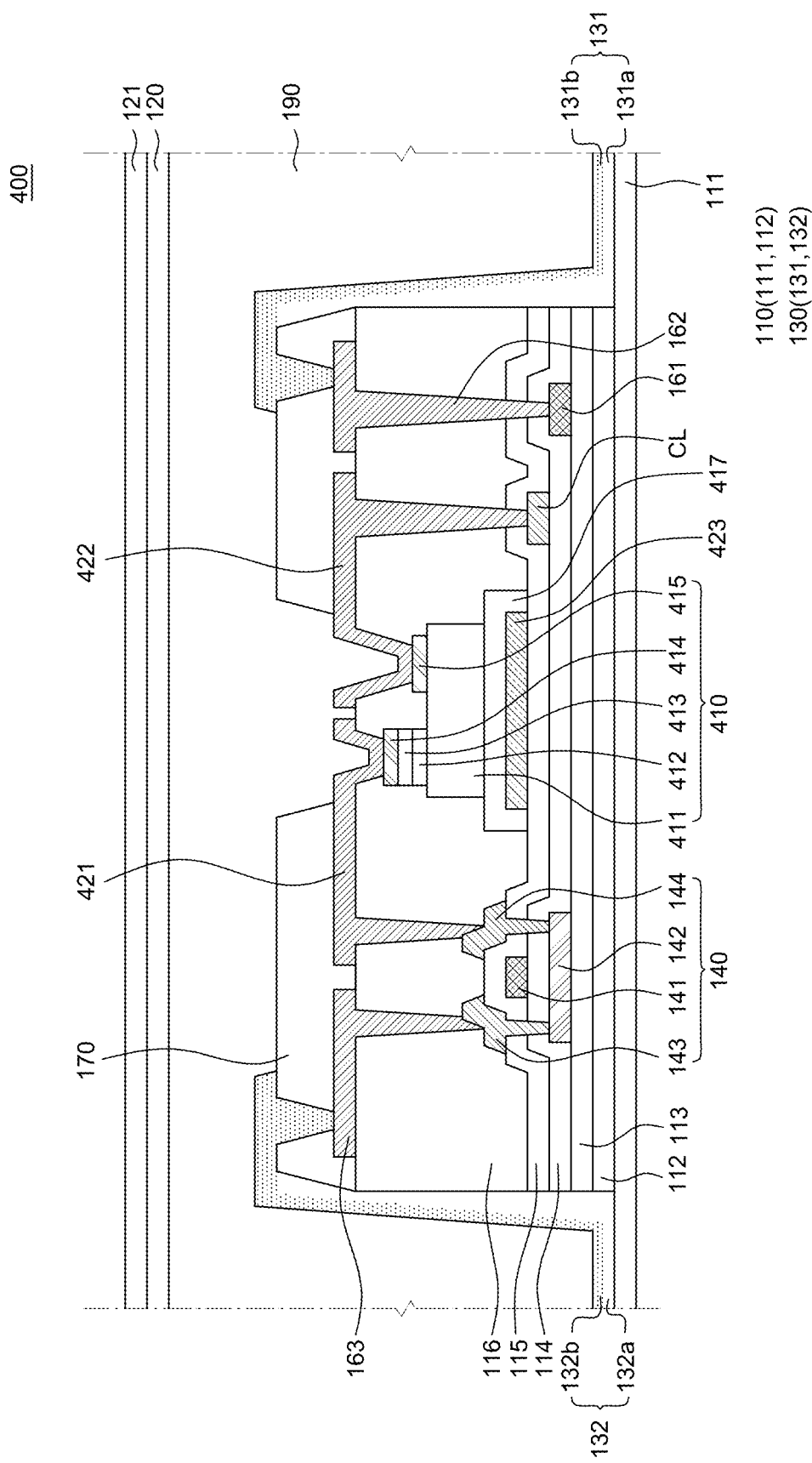
FIG. 4 is a schematic cross-sectional view of a sub-pixel according to another aspect of FIG. 2.

FIG. 4 is a schematic cross-sectional view of a sub-pixel according to another aspect of FIG. 2.

The structure of a sub-pixel shown in FIG. 4 is substantially the same as the structure of the sub-pixel shown in FIG. 3 except an emission element. Therefore, redundant description of the same components will not be provided.

Referring to FIG. 4, a common line CL is disposed on the gate insulating layer 114. The common line CL serves to apply a common voltage to the plurality of sub-pixels SPX. The common line CL may be formed of the same material as the source electrode 143 and the drain electrode 144 of the transistor 140 but is not limited thereto.

Further, a reflective layer 423 is disposed on the interlayer insulating layer 115. The reflective layer 423 serves to reflect light emitted toward the first substrate 110 from an LED 410 to above the stretchable display device 1000 so as to be released to the outside. The reflective layer 423 may be formed of a metal material having a high reflectivity.

A first adhesive layer 417 covering the reflective layer 423 is disposed on the reflective layer 423. The first adhesive layer 417 serves to bond the LED 410 onto the reflective layer 423 and may also insulate the reflective layer 423 formed of a metal material from the LED 410. The first adhesive layer 417 may be formed of a thermosetting material or a photocurable material but is not limited thereto. FIG. 4 illustrates that the first adhesive layer 417 is disposed to cover the reflective layer 423 only, but the location of the first adhesive layer 417 is not limited thereto.

The LED 410 is disposed on the first adhesive layer 417. The LED 410 is disposed overlapping the reflective layer 423. The LED 410 includes an n-type layer 411, an active layer 412, a p-type layer 413, a p-electrode 414, and an n-electrode 415. Hereafter, the LED 410 having a lateral structure will be described, but the structure of the LED 410 is not limited thereto.

Specifically, the n-type layer 411 of the LED 410 is disposed on the first adhesive layer 417 to overlap the reflective layer 423. The n-type layer 411 may be formed by injecting an n-type impurity into gallium nitride having excellent crystallinity. The active layer 412 is disposed on the n-type layer 411. The active layer 412 serves as an emission layer that emits light in the LED 410 and may be formed of semiconductor nitride, e.g., indium gallium nitride. The p-type layer 413 is disposed on the active layer 412. The p-type layer 413 may be formed by injecting a p-type impurity into gallium nitride. However, the materials of the n-type layer 411, the active layer 412, and the p-type layer 413 are not limited thereto.

The p-electrode 414 is disposed on the p-type layer 413 of the LED 410. Further, the n-electrode 415 is disposed on the n-type layer 411 of the LED 410. The n-electrode 415 is disposed as spaced apart from the p-electrode 414. Specifically, the LED 410 may be manufactured by sequentially laminating the n-type layer 411, the active layer 412, and the p-type layer 413, etching predetermined regions of the active layer 412 and the p-type layer 413, and forming the n-electrode 415 and the p-electrode 414. In this case, the predetermined regions are spaces to separate the n-electrode 415 and the p-electrode 414. The predetermined regions can be etched by exposing parts of the n-type layer 411. In other words, a surface of the LED 410 on which the n-electrode 415 and the p-electrode 414 are to be disposed may not be flat but may have different levels of height. Thus, the p-electrode 414 is disposed on the p-type layer 413 and the n-electrode 415 is disposed on the n-type layer 411. Further, the p-electrode 414 and the n-electrode 415 are disposed as spaced apart from each other at different levels of height. Therefore, the n-electrode 415 may be disposed closer to the reflective layer 423 than the p-electrode 414. Further, the n-electrode 415 and the p-electrode 414 may be formed of conductive materials, e.g., transparent conductive oxide. Furthermore, the n-electrode 415 and the p-electrode 414 may be formed of the same material. However, the present disclosure is not limited thereto.

The overcoating layer 116 is disposed on the interlayer insulating layer 114 and the first adhesive layer 417. The overcoating layer 116 serves to flatten a top surface of the transistor 140. The overcoating layer 116 may be disposed flattening the top surface of the transistor 140 in the regions except the region where the LED 410 is disposed. In this case, the overcoating layer 116 may also be formed of two or more layers.

A first electrode 421 and a second electrode 422 are disposed on the overcoating layer 116. The first electrode 421 serves to electrically connect the transistor 140 and the LED 410. The first electrode 421 is connected to the p-electrode 414 of the LED 410 through the contact hole formed in the overcoating layer 116. Further, the first electrode 421 is connected to the drain electrode 144 of the transistor 140 through the contact holes formed in the overcoating layer 116 and the interlayer insulating layer 115. However, the present disclosure is not limited thereto. The first electrode 421 may also be connected to the source electrode 143 of the transistor 140 depending on the type of the transistor 140. The p-electrode 414 of the LED 410 and the drain electrode 144 of the transistor 140 are electrically connected to each other by the first electrode 421.

The second electrode 422 serves to electrically connect the LED 410 and the common line CL. Specifically, the second electrode 422 is connected to the common line CL through the contact holes formed in the overcoating layer 116 and the interlayer insulating layer 115. Further, the second electrode 422 is connected to the n-electrode 415 of the LED 410 through the contact hole formed in the overcoating layer 116. Therefore, the common line CL and the n-electrode 415 of the LED 410 are electrically connected to each other.

When the stretchable display device 1000 is turned on, different levels of voltage may be applied to the drain electrode 144 of the transistor 140 and the common line CL, respectively. A voltage applied to the drain electrode 144 of the transistor 140 may be applied to the first electrode 421 and a common voltage may be applied to the second electrode 422. Different levels of voltage may be applied to the p-electrode 414 and the n-electrode 415 through the first electrode 421 and the second electrode 422. Thus, the LED 410 may emit light.

FIG. 4 illustrates that the transistor 140 is electrically connected to the p-electrode 414 and the common line CL is electrically connected to the n-electrode 415, but the present disclosure is not limited thereto. The transistor 140 may be electrically connected to the n-electrode 415 and the common line CL may be electrically connected to the p-electrode 414.

The bank 170 is disposed on the overcoating layer 116, the first electrode 421, the second electrode 422, the data pad 163, and the connection pad 162. The bank 170 is disposed to overlap an end of the reflective layer 423, and the other part of the reflective layer 423 which does not overlap the bank 170 may be defined as an emission region. The bank 170 may be formed of an organic insulating material and may be formed of the same material as the overcoating layer 116. Further, the bank 170 may contain a black material to suppress color mixing which occurs when light emitted from the LED 410 is transmitted to the adjacent sub-pixel SPX.

As described above, in the stretchable display device 1000 according to an aspect of the present disclosure, the emission element may be configured as the organic light emitting element or may be configured as the LED 410. Since the LED 410 is formed of an inorganic material instead of an organic material, the LED 410 has high reliability. Thus, the LED 410 has a longer lifetime than a liquid crystal display element or an organic light emitting element. Further, the LED 410 has high lighting speed, low power consumption, and high impact resistance, which results in excellent stability. Furthermore, the LED 410 has excellent emission efficiency and thus can display high-brightness images. Therefore, the LED 410 is applicable to an extra-large screen. Particularly, the LED 410 is formed of an inorganic material instead of an organic material and thus may not use an encapsulation layer which is required for an organic light emitting element. Thus, the encapsulation layer which may be easily damaged such as cracked while the stretchable display device 1000 is stretched can be omitted. Therefore, in the stretchable display device 1000 according to yet another aspect of the present disclosure, the LED 410 is used as a display element. Thus, the encapsulation layer which can be damaged when the stretchable display device 1000 is changed in shape by bending or stretching may not be used. Further, since the LED 410 is formed of an inorganic material instead of an organic material, the display element of the stretchable display device 1000 according to yet another aspect of the present disclosure can be protected against moisture or oxygen and may have high reliability.

Figure 5A:
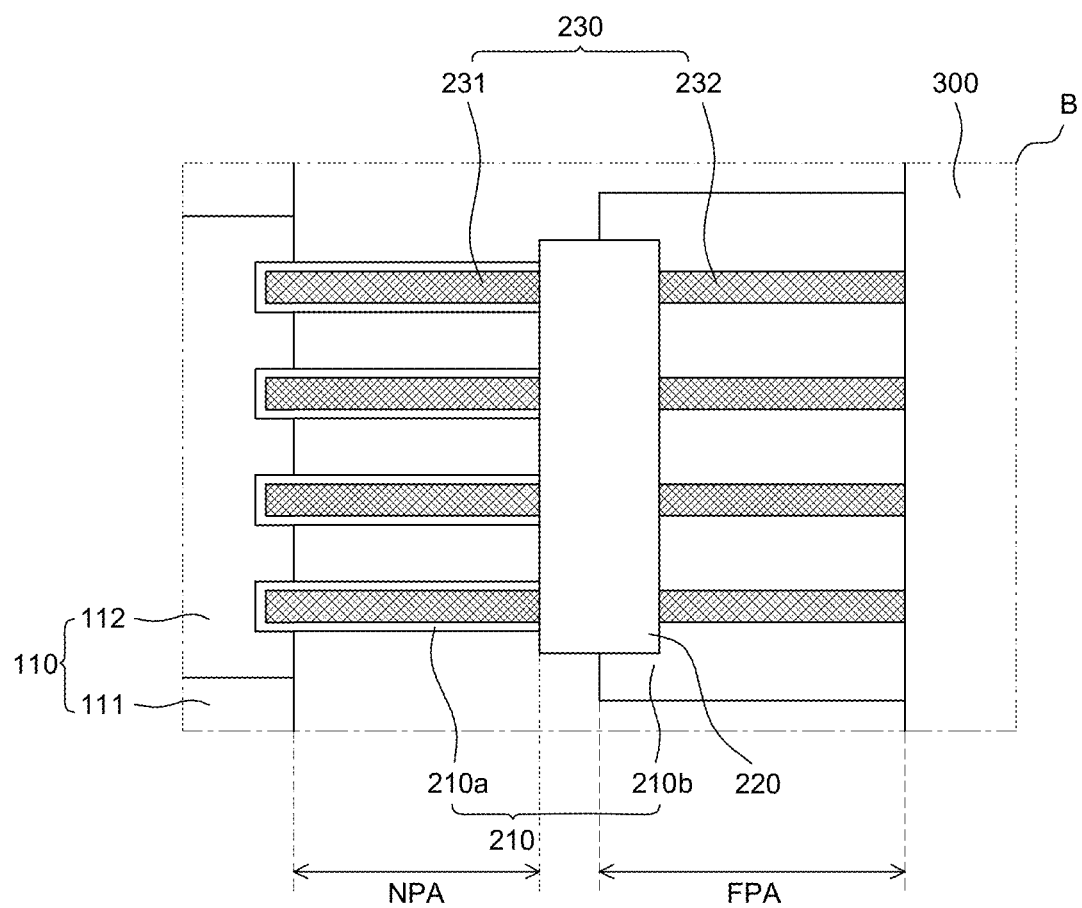
FIG. 5A and FIG. 5B are enlarged plan views illustrating a region "B" of FIG. 1B.
Figure 5B:
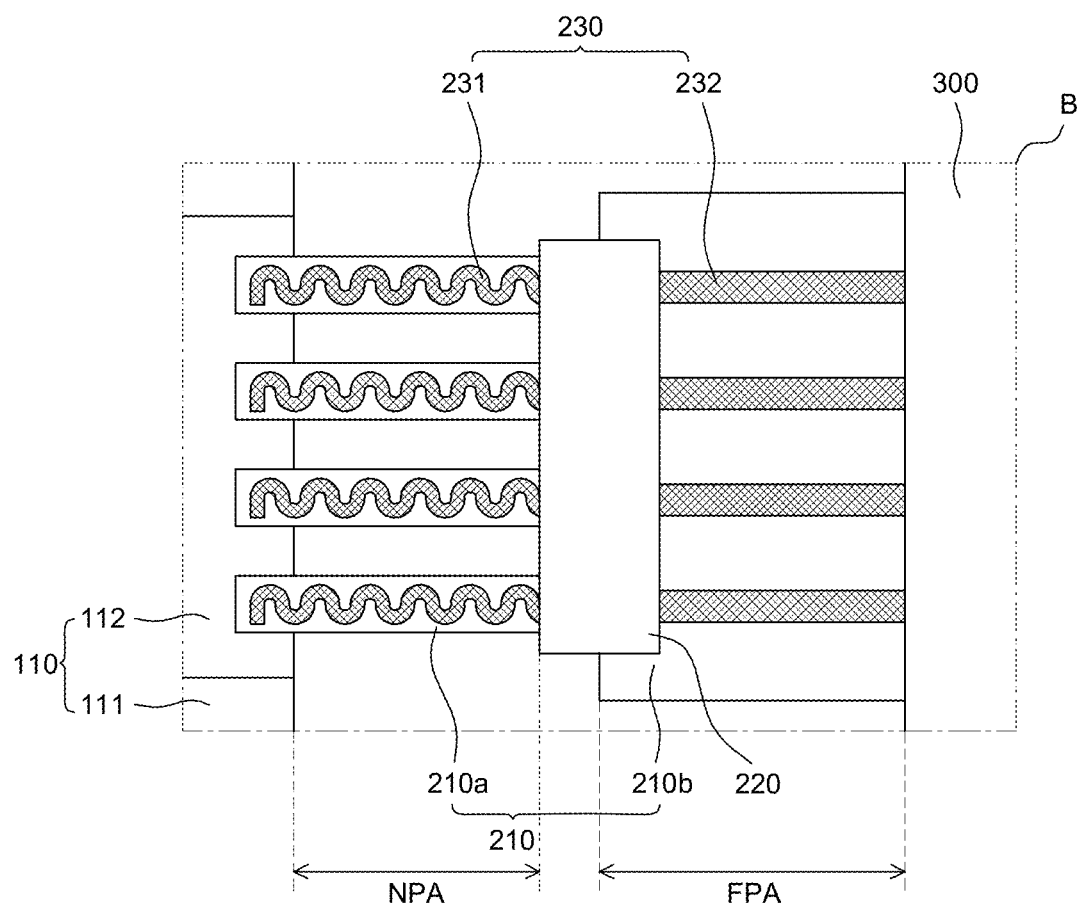

FIG. 5A and FIG. 5B are enlarged plan views illustrating a region "B" of FIG. 1B.

Referring to FIG. 5A and FIG. 5B, in the non-active area N/A of the first substrate 110 of the stretchable display device 1000 according to an aspect of the present disclosure, the island substrate 112 is disposed on the lower substrate 111. Further, a plurality of bonding pads (not illustrated) for electrical connection with the flexible printed circuit film 200 is disposed on the island substrate 112.

The plurality of bonding pads (not illustrated) disposed in the non-active area N/A is electrically connected to respective film bonding pads (not illustrated) disposed on the flexible printed circuit film 200. The plurality of bonding pads on the island substrate 112 may be electrically connected to the respective film bonding pads disposed on the flexible printed circuit film 200 by an anisotropy conductive film (ACF).

Referring to FIG. 5A and FIG. 5B, the flexible printed circuit film 200 may include a first film area NPA adjacent to the display panel 100 and a second film area FPA adjacent to the printed circuit board 300. The first film area NPA and the second film area FPA can be separated by the driving circuit chip 220.

The first film area NPA is adjacent to the stretchable display panel 100. A base film disposed in the first film area NPA may be separated corresponding to a plurality of conductive lines 231 disposed in the first film area NPA. The base film disposed in the first film area NPA may be referred to as a first base film. In this case, the first base film 210a can be separated into a plurality of sub-base films 210a so as to correspond to the plurality of conductive lines 231, respectively. The first film area NPA of the flexible printed circuit film 200 may include the first base film 210a separated into a plurality of sub-base films and a plurality of first conductive lines 231 disposed under the plurality of sub-base films 210a, respectively.

The plurality of sub-base films 210a serves to support the first conductive lines 231 disposed on the respective sub-base films 210a. The plurality of sub-base films 210a may be formed of an insulating material having flexibility and may be formed of, e.g., PI-based resin or epoxy-based resin. Any one of the first conductive lines 231 may be disposed on each of the plurality of sub-base films 210a. That is, the plurality of sub-base films 210a may one-by-one correspond to the plurality of first conductive lines 231. It has been described that in the stretchable display device 1000 according to an aspect of the present disclosure, a single first conductive line 231 is disposed on a single sub-base film 210a of the flexible printed circuit film 200. However, the present disclosure is not limited thereto. The number of first conductive lines 231 to be disposed on the sub-base film 210a may be adjusted depending on a stretch rate of the display panel 100. For example, if the display panel 100 has a stretch rate of up to 40%, a single first conductive line 231 may be disposed on each sub-base film 210a. If the display panel 100 has a stretch rate of up to 20%, two first conductive lines 231 may be disposed on each sub-base film 210a. The first conductive lines 231 are disposed on atop surface of the plurality of sub-base films 210a. Thus, each of the plurality of first sub-base films 210a may have a greater width than each of the first conductive lines 231 disposed thereon. The plurality of sub-base films 210a may have a greater width than the bonding pads disposed in the non-active area N/A of the display panel 100.

The plurality of first conductive lines 231 outputs drive control signals such as a gate control signal and a data control signal output from the driving circuit chip 220 to the display panel 100. As shown in FIG. 5A, the plurality of first conductive lines 231 may be formed into straight lines like the connection lines 130 disposed on the display panel 100 but is not limited thereto. As shown in FIG. 5B, the plurality of first conductive lines 231 may be disposed in a wave shape. Further, although not illustrated in the drawings, the plurality of first conductive lines 231 may be disposed in a diamond shape. If the plurality of first conductive lines 231 has a wave shape or a diamond shape, damage to the first conductive lines 231 can be minimized when the display panel 100 is stretched, compared to the case where the conductive lines 231 are straight lines.

Although not illustrated in the drawings, a plurality of first film bonding pads corresponding to the bonding pads of the display panel 100 may be disposed where the plurality of first sub-base films 210a is bonded to the bonding pads of the display panel 100. The plurality of first film bonding pads may also be disposed corresponding to the plurality of first sub-base films 210a.

The driving circuit chip 220 is disposed in a central region of the flexible printed circuit film 200. One side of the driving circuit chip 220 is connected to the first base film 210a separated into a plurality of sub-base films corresponding to the plurality of first conductive lines 231 in the first film area NPA. The other side of the driving circuit chip 220 is connected to a second base film 210b which is not separated into a plurality of sub-base films corresponding to a plurality of second conductive lines 232 in the second film area FPA. The driving circuit chip 220 receives drive data such as a power signal and a drive signal from the printed circuit board 300 through the plurality of second conductive lines 232 in the second film area FPA. Then, the driving circuit chip 220 generates and outputs a drive control signal to the display panel 100.

The second film area FPA of the flexible printed circuit film 200 is disposed far from the stretchable display panel 100 with respect to the driving circuit chip 220. That is, the second film area FPA is disposed adjacent to the printed circuit board 300. The second film area FPA of the flexible printed circuit film 200 may include the second base film 210b and the plurality of second conductive lines 232 disposed on the second base film 210b.

As for the base film disposed in the second film area FPA, the plurality of second conductive lines 232 may be disposed on a single second base film 210b. That is, the second base film 210b disposed in the second film area FPA is not separated corresponding to the plurality of second conductive lines 232. The second base film 210b may be formed of an insulating material having flexibility and may be formed of, e.g., PI-based resin or epoxy-based resin.

The plurality of second conductive lines 232 receives drive data such as a power signal and a drive signal from the printed circuit board 300 and transfers the data to the driving circuit chip 220.

As described above, in the flexible printed circuit film 200 of the stretchable display device 1000 according to an aspect of the present disclosure, the first base film 210a disposed in the first film area NPA adjacent to the stretchable display panel 100 is composed of a plurality of sub-base films. The plurality of sub-base films is separated from each other corresponding to the plurality of first conductive lines 231, respectively. Thus, even if the first base film 210a is not stretchable, when the display panel 100 is stretched, it is possible to reduce stress concentrated on a predetermined region of the flexible printed circuit film 200, particularly, a predetermined region of where the flexible printed circuit film 200 is bonded to the display panel 100.

Figure 6A:
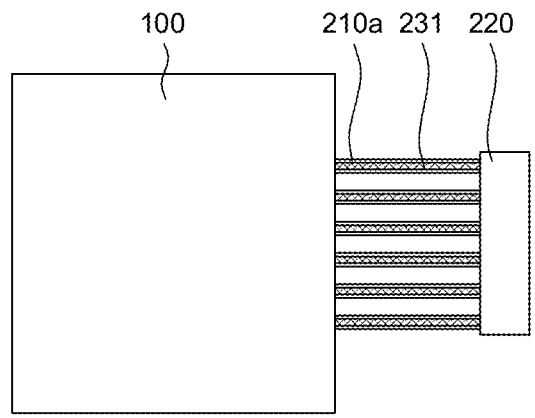
FIG. 6A is a plan view illustrating a display panel of a stretchable display device according to an aspect of the present disclosure before it is stretched.
Figure 6B:
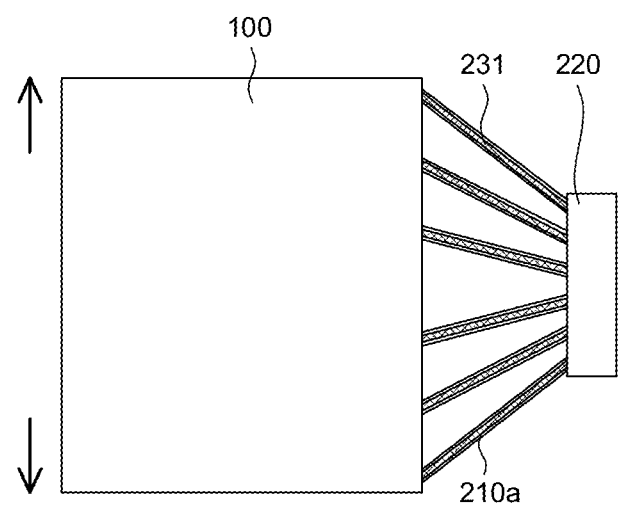
FIG. 6B is a plan view illustrating the display panel of the stretchable display device according to an aspect of the present disclosure when it is stretched.

FIG. 6A is a plan view illustrating a display panel of a stretchable display device according to an aspect of the present disclosure before it is stretched. FIG. 6B is a plan view illustrating the display panel of the stretchable display device according to an aspect of the present disclosure when it is stretched.

Referring to FIG. 6A, in a normal state before the display panel 100 of the stretchable display device 1000 is stretched, the plurality of first sub-base films 210a in the first film area NPA of the flexible printed circuit film 200 is spaced apart from each other at a predetermined distance.

Then, as shown in FIG. 6B, when the display panel 100 of the stretchable display device 1000 is stretched, the distance between the plurality of first sub-base films 210a in the first film area NPA of the flexible printed circuit film 200 increases as being closer to the display panel 100. That is, when the extensible display panel 100 is stretched, the distance between the first sub-base films 210a separated corresponding to the plurality of conductive lines 231 may increase so as to correspond to the stretched display panel 100. Therefore, the stretchable display device 1000 according to an aspect of the present disclosure can distribute stress of the flexible printed circuit film 200 caused by stretching of the display panel 100. Thus, damage to the flexible printed circuit film 200 can be minimized.

Figure 7A:
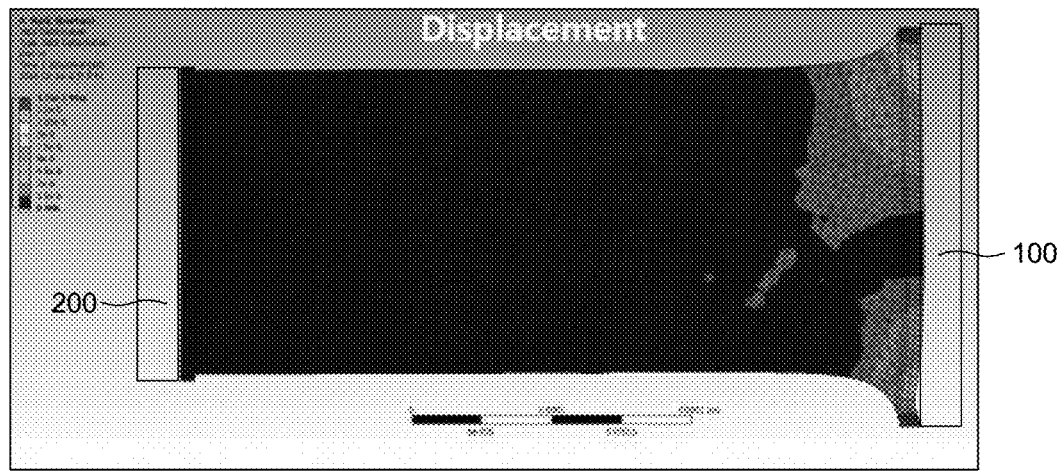
FIG. 7A shows an example of displacement and stress of a flexible printed circuit film when a typical stretchable display device is stretched.
Figure 7A:
Figure 7B:
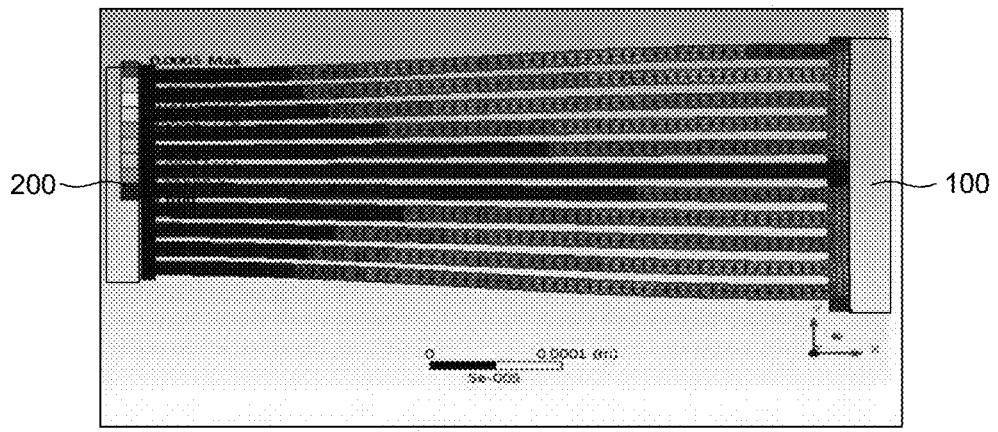
FIG. 7B shows an example of displacement and stress of a flexible printed circuit film when a stretchable display device according to the present disclosure is stretched.
Figure 7B:
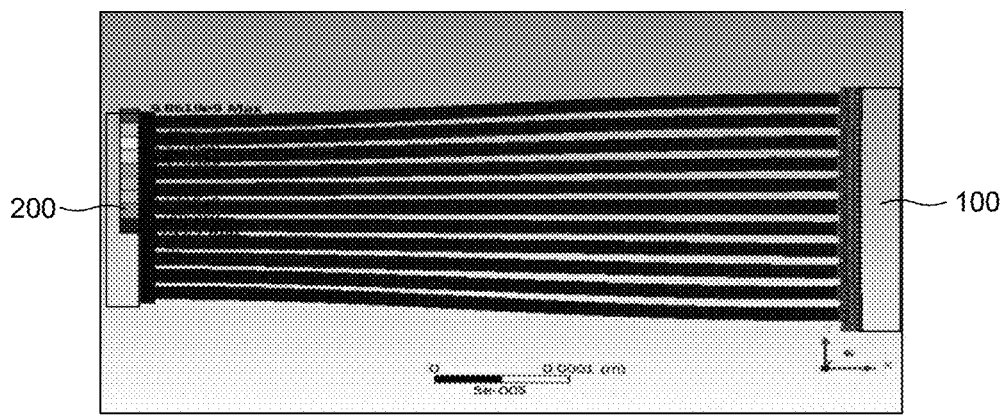

FIG. 7A shows an example of displacement and stress of a flexible printed circuit film when a typical stretchable display device is stretched. FIG. 7B shows an example of displacement and stress of a flexible printed circuit film when a stretchable display device according to an aspect of the present disclosure is stretched.

Referring to FIG. 7A, (a) shows the displacement of a display panel and a flexible printed circuit film in a typical stretchable display device. Further, (b) shows stress of the display panel and the flexible printed circuit film in the typical stretchable display device.

Referring to (a) of FIG. 7A, the flexible printed circuit film in the typical stretchable display device is formed of a flexible material, but a base film is not separated for each conductive line. Thus, when the display panel is stretched, the flexible printed circuit film is not changed in shape accordingly. Therefore, the display panel and the flexible printed circuit film do not match in displacement. Particularly, in a bonding area between the display panel and the flexible printed circuit film, the flexible printed circuit film may be damaged.

Referring to (b) of FIG. 7A, in the typical stretchable display device, the flexible printed circuit film is not configured corresponding to the extensible display panel. Thus, when the display panel is stretched, stress is concentrated on specific regions a and b of the bonding area between the display panel and the flexible printed circuit film. As such, stress is concentrated on the specific regions a and b, particularly the outermost regions of the bonding area. Thus, the bonding between the display panel and the flexible printed circuit film may be separated or damaged. Therefore, in the typical stretchable display device, electrical connection between the display panel and the flexible printed circuit film may be damaged. Thus, the reliability may be decreased.

Referring to FIG. 7B, (a) shows the displacement of a display panel and a flexible printed circuit film in a stretchable display device according to an aspect of the present disclosure. Further, (b) shows stress of the display panel and the flexible printed circuit film in the stretchable display device according to an aspect of the present disclosure.

Referring to (a) of FIG. 7B, the base film of the flexible printed circuit film 200, i.e., the first base film 210a disposed adjacent to the display panel 100 with respect to the driving circuit chip 220, in the stretchable display device 1000 according to an aspect of the present disclosure is formed of a flexible material. Also, the first base film 210a is separated corresponding to the plurality of conductive lines 231. Thus, when the display panel 100 is stretched, the flexible printed circuit film 200 can be changed in shape accordingly. Therefore, there may be no mismatch of displacement between the display panel 100 and the flexible printed circuit film 200.

Referring to (b) of FIG. 7B, in the stretchable display device 1000 according to an aspect of the present disclosure, the base film 210a of the flexible printed circuit film 200 disposed adjacent to the display panel 100 is separated and disposed for the plurality of conductive lines 231 considering a maximum stretch rate of the display panel 100 such that the flexible printed circuit film 200 can correspond to the extensible display panel 100. Thus, when the display panel 100 is stretched, stress of a bonding area between the display panel 100 and the flexible printed circuit film 200 is reduced, compared to the stress shown in (b) of FIG. 7A. That is, stress of the bonding area between the display panel 100 and the flexible printed circuit film 200 of the stretchable display device 1000 according to an aspect of the present disclosure is not concentrated on a specific region. Therefore, in stretchable display device 1000 according to an aspect of the present disclosure, when the display panel 100 is stretched, the display panel 100 and the flexible printed circuit film 200 may not be separated or damaged. Thus, the reliability of the stretchable display device 1000 can be increased.

In the present disclosure, as described above, the structure of the base film of the flexible printed circuit film 200 is improved to suppress concentration of stress on a specific region of the flexible printed circuit film 200 in order to correspond to the extensible display panel 100. In another aspect, a flexible printed circuit film which is improved to be extended and contracted in response to extension and contraction of the display panel 100 will be suggested.

Figure 8A:
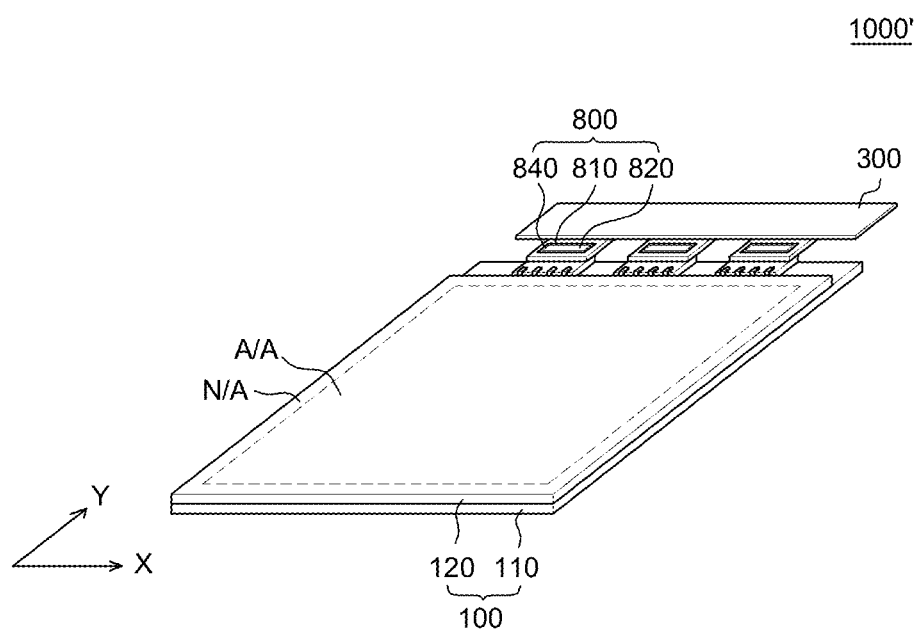
FIG. 8A and FIG. 8B show a perspective view and an exploded perspective view of a stretchable display device according to another aspect of the present disclosure.
Figure 8B:
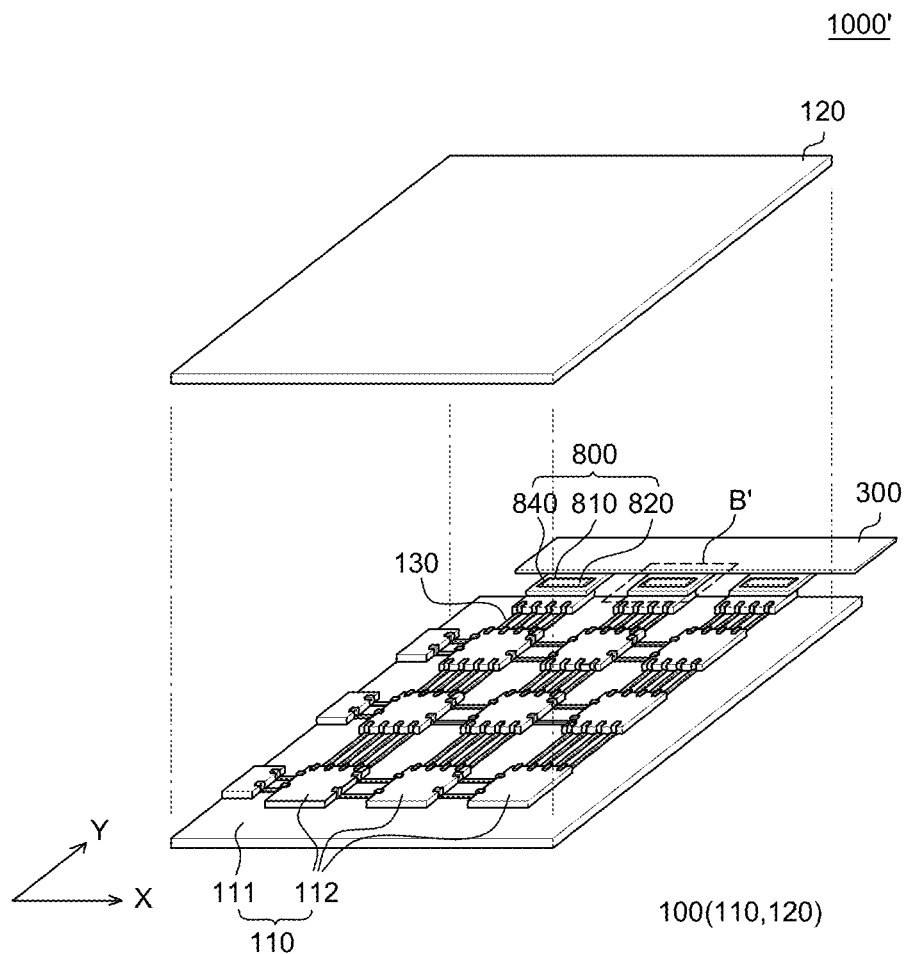

FIG. 8A and FIG. 8B show a perspective view and an exploded perspective view of a stretchable display device according to another aspect of the present disclosure.

Referring to FIG. 8A and FIG. 8B, a stretchable display device 1000' according to another aspect of the present disclosure includes the display panel 100, a flexible printed circuit film 800, and the printed circuit board 300. The stretchable display device 1000' according to another aspect of the present disclosure is substantially the same as the stretchable display device 1000 shown in FIG. 1A and FIG. 1B except for the structure of a flexible printed circuit film. Therefore, redundant description of the same components will not be provided.

In the stretchable display device 1000' according to another aspect of the present disclosure, the flexible printed circuit film 800 may include a base film 810 and a driving circuit chip 820 disposed on the base film 810. The flexible printed circuit film 800 may also include a plurality of conductive lines (not illustrated) for transferring a signal input from the outside to at least one of a top surface and a bottom surface of the base film 810. The flexible printed circuit film 800 may further include a rigid substrate 840 disposed on at least one of the top surface and the bottom surface of the base film 810.

The base film 810 serves to support the driving circuit chip 820. The base film 810 may be formed of the same material as the lower substrate 111 of the first substrate 110 in the display panel 100. The base film 810 may be formed as a ductile film of an insulating material which can be bent or stretched. For example, the base film 810 may be formed of silicone rubber such as PDMS or an elastomer such as PU. However, the materials of the base film 810 are not limited thereto. Accordingly, the base film 810 is stretchable in at least one of an X-axis direction which is a first direction and a second direction perpendicular to the X-axis direction, i.e., Y-axis direction.

The base film 810 is a ductile film and can be reversibly expanded and contracted. Further, the base film 810 may have an elastic modulus ranging from several MPa to several hundreds of MPa and may have a stretch failure of 100% or more.

On the top surface of the base film 810, a plurality of conductive lines (not illustrated) is disposed. The plurality of conductive lines serves to receive an image data signal and a drive data signal from the printed circuit board 300 and transfer the signals to the driving circuit chip 820. Also, the plurality of conductive lines transfers a gate control signal and a data control signal generated by the driving circuit chip 820 to the display panel 100.

A plurality of rigid substrates 840 may be disposed on at least one of the top surface and the bottom surface of the base film 810. More specifically, the plurality of rigid substrates 840 may be disposed where the driving circuit chip 820 is disposed, where the plurality of rigid substrates 840 is bonded to the display panel 100, and where the plurality of rigid substrates 840 is bonded to the printed circuit board 300 in the flexible printed circuit film 800. The driving circuit chip 820 may be disposed on any one of the plurality of rigid substrates 840. Therefore, even if the base film 810 of the flexible printed circuit film 800 is formed of a ductile material, damage to the driving circuit chip 820 can be minimized. The plurality of rigid substrates 840 may be more rigid than the base film 810. That is, the base film 810 may be more ductile than the plurality of rigid substrates 840 and the plurality of rigid substrates 840 may be more rigid than the base film 810.

The plurality of rigid substrates 840 may be formed of a plastic material having flexibility and may be formed of, e.g., PI.

The plurality of rigid substrates 840 may have a higher modulus than the base film 810. Herein, the modulus refers to an elastic modulus that is the ratio of the stress applied to a substrate to the change caused by the stress. If the modulus is relatively high, the rigidity may be relatively high. Therefore, the plurality of rigid substrates 840 may be rigid relative to the base film 810. The modulus of the plurality of rigid substrates 840 may be 1000 times or more than that of the base film 810 but is not limited thereto.

A plurality of conductive lines may be disposed on the base film 810. Each of the plurality of conductive lines may be disposed between the plurality of rigid substrates 840. That is, the plurality of conductive lines may be disposed on the base film 810. The plurality of conductive lines may include a plurality of conductive signal lines disposed on the plurality of rigid substrates 840 and a plurality of conductive connection lines disposed on the base film 810 formed of a ductile material.

The driving circuit chip 820 is disposed on the rigid substrate 840 in a central region of the base film 810. The driving circuit chip 820 processes data for displaying an image input from the outside and a drive signal for processing the data. FIG. 8A and FIG. 8B illustrate that the driving circuit chip 820 is mounted by a chip on film (COF) method, but is not limited thereto. The driving circuit chip 820 may also be mounted by a chip on glass (COG) method or a tape carrier package (TCP) method.

In the stretchable display device 1000' according to another aspect of the present disclosure, the base film 810 of the flexible printed circuit film 800 is formed of a ductile material. Thus, when the display panel 100 is stretched, the flexible printed circuit film 800 can be stretched accordingly.

Further, in the stretchable display device 1000' according to another aspect of the present disclosure, the rigid substrates 840 are disposed where the display panel 100 is bonded to the printed circuit board 300 and where the driving circuit chip 820 is disposed. Therefore, even if the flexible printed circuit film 800 is formed of a ductile material, the display panel 100 can be bonded to the printed circuit board 300 under conventional processing conditions. Also, damage to the driving circuit chip 820 caused by stretching can be suppressed.

A detailed structure of the stretchable display device 1000' according to another aspect of the present disclosure will be described with reference to FIG. 9 through FIG. 11B.

Figure 9:
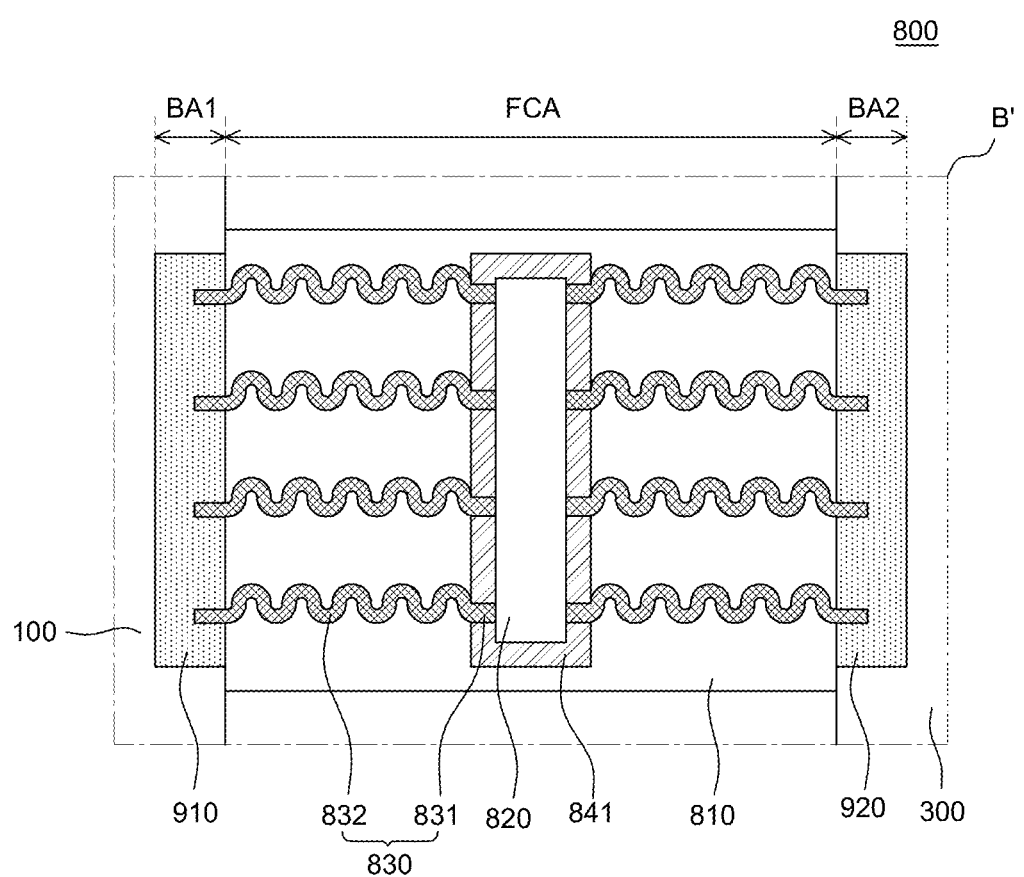
FIG. 9 is an enlarged plan view illustrating a region "B'" of FIG. 8B.
Figure 10:
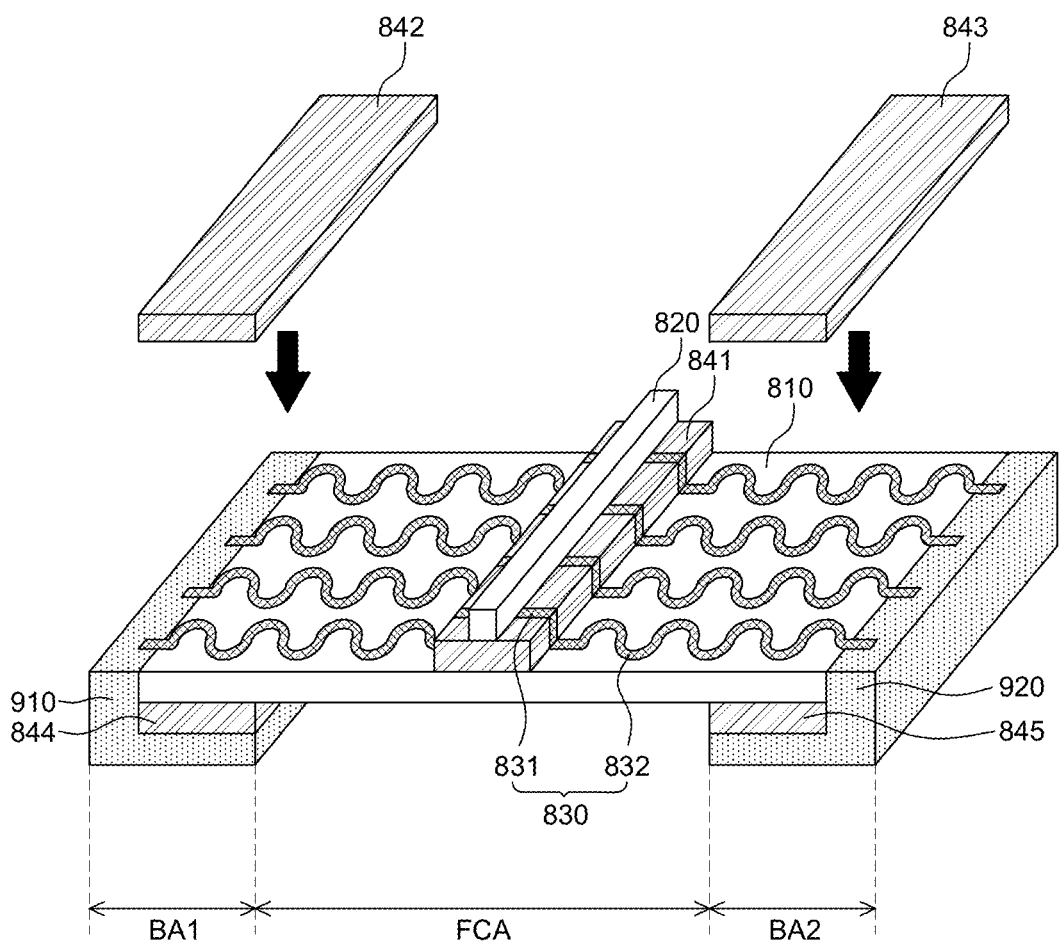
FIG. 10 is an exploded perspective view illustrating a detailed structure of a flexible printed circuit film of a stretchable display device according to another aspect of the present disclosure.
Figure 11A:
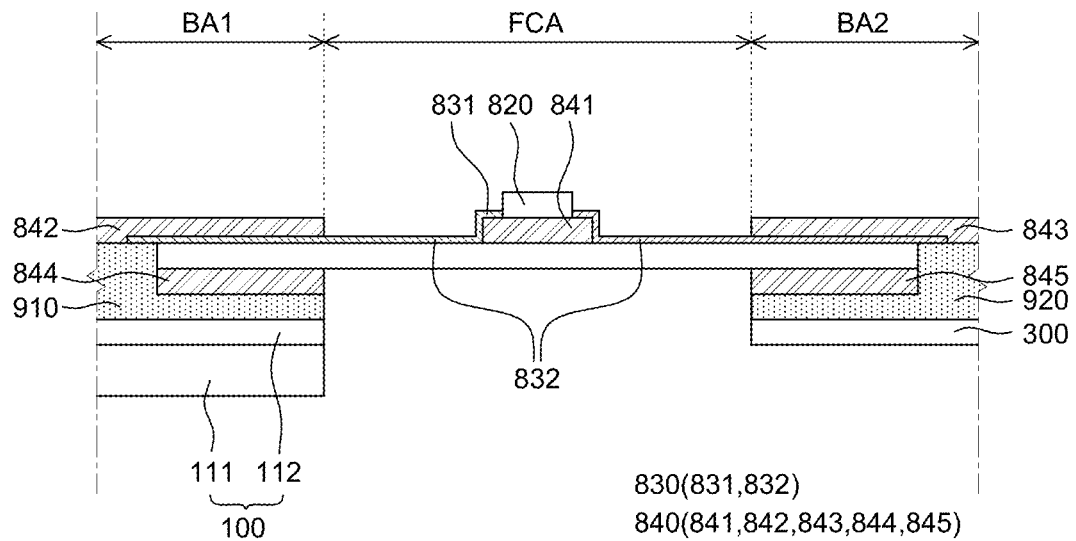
FIG. 11A is a schematic cross-sectional view of FIG. 10.
Figure 11B:
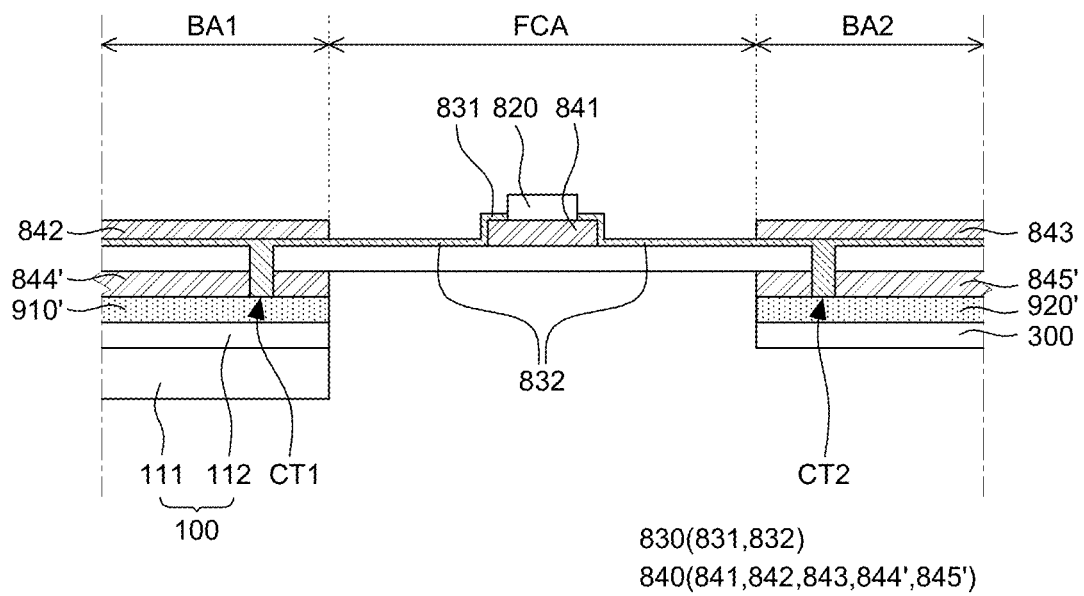
FIG. 11B is a schematic cross-sectional view according to another aspect of FIG. 10.

FIG. 9 is an enlarged plan view illustrating a region "B'" of FIG. 8B. FIG. 10 is an exploded perspective view illustrating a detailed structure of a flexible printed circuit film of a stretchable display device according to another aspect of the present disclosure. FIG. 11A is a schematic cross-sectional view of FIG. 10. FIG. 11B is a schematic cross-sectional view according to another aspect of FIG. 10.

Referring to FIG. 9 through FIG. 11B, the flexible printed circuit film 800 of the stretchable display device 1000' according to another aspect of the present disclosure may include a first bonding area BA1, a film center area FCA, and a second bonding area BA2.

The film center area FCA may refer to the flexible printed circuit film 800 except the first bonding area BA1 and the second bonding area BA2. The film center area FCA may include a region where a first rigid substrate 841 having a predetermined width is disposed on the base film 810 and the driving circuit chip 820 is disposed on the first rigid substrate 841. Although not illustrated in the drawings, the first rigid substrate 841 and the driving circuit chip 820 may be bonded to each other with an adhesive.

The driving circuit chip 820 and a plurality of conductive signal lines 831 may be disposed on the first rigid substrate 841.

The first rigid substrate 841 may have a greater width than the driving circuit chip 820. However, the first rigid substrate 841 may have a smaller width than the base film 810.

In the film center area FCA where the first rigid substrate 841 is not disposed, a plurality of conductive connection lines 832 may be disposed. The plurality of conductive connection lines 832 is electrically connected to the plurality of conductive signal lines 831 disposed on a top surface of the first rigid substrate 841. Thus, the plurality of conductive connection lines 832 can transfer a drive control signal output from the driving circuit chip 820 to the display panel 100. The plurality of conductive connection lines 832 may be disposed in a wave shape to minimize the occurrence of cracks in the lines when the base film 810 is stretched. In the present aspect, the plurality of conductive connection lines 832 is illustrated as disposed in a wave shape but is not limited thereto. The plurality of conductive connection lines 832 may be disposed in any shape such as a diamond shape capable of minimizing the occurrence of cracks in the lines.

The plurality of conductive signal lines 831 may be disposed on both sides of the driving circuit chip 820 on the first rigid substrate 841 and may be formed into straight lines. The plurality of conductive signal lines 831 may be electrically connected to the plurality of conductive connection lines 832 disposed on the base film 810. Herein, the plurality of conductive signal lines 831 on the first rigid substrate 841 and the plurality of conductive connection lines 832 on the base film 810 may be electrically connected through signal pads which are not illustrated. The signal pads are provided on the first rigid substrate 841. However, electrical connection between the plurality of conductive signal lines 831 on the first rigid substrate 841 and the plurality of conductive connection lines 832 on the base film 810 is not limited thereto. The plurality of conductive signal lines 831 and the plurality of conductive connection lines 832 may be electrically connected by coating a metal material on connection portions between the conductive signal lines 831 and the conductive connection lines 832 by inkjet printing. Otherwise, the plurality of conductive signal lines 831 and the plurality of conductive connection lines 832 may be electrically connected through a contact hole formed in the first rigid substrate 841. The plurality of conductive signal lines 831 and conductive connection lines 832 may be formed of conductive metal materials or may be formed of the same material as connection lines disposed on the display panel 100. As described above, the flexible printed circuit film 800 of the stretchable display device 1000' according to another aspect of the present disclosure is formed of a ductile material. Further, the first rigid substrate 841 is disposed where the driving circuit chip 820 is disposed. Therefore, damage to the driving circuit chip 820 caused by stretching can be suppressed.

The first bonding area BA1 is an area where the display panel 100 is bonded. Referring to FIG. 9, in the first bonding area BA1, the display panel 100, more specifically, the island substrates 112 of the first substrate 110, a first anisotropy conductive film 910 for electrically connecting the display panel 100 and the flexible printed circuit film 800, and the flexible printed circuit film 800 are disposed.

Referring to FIG. 10 and FIG. 11A, in the first bonding area BA1, a second rigid substrate 842 on the top surface of the base film 810 and a fourth rigid substrate 844 on the bottom surface of the base film 810 may be disposed. A bottom surface of the fourth rigid substrate 844, a lateral surface of the fourth rigid substrate 844, and a lateral surface of the base film 810 may be in contact with the first anisotropy conductive film 910.

Referring to FIG. 10 and FIG. 11A, the second rigid substrate 842 may be disposed on the top surface of the base film 810. The second rigid substrate 842 may be provided such that the display panel 100 and the flexible printed circuit film 800 can be bonded to each other under the conventional processing conditions. The second rigid substrate 842 may be bonded to the base film 810 with an adhesive.

In a typical display device, a display panel and a flexible printed circuit film are bonded to each other by placing an anisotropy conductive film on the display panel and placing the flexible printed circuit film on the anisotropy conductive film, followed by thermal pressing. In this case, the thermal pressing is performed at a temperature of up to 240°C. As described in another aspect of the present disclosure, if the flexible printed circuit film 800 is formed of a ductile material, it can be easily damaged at high temperature due to the properties of the ductile material. Thus, the bonding process cannot be performed under the conventional processing conditions.

Therefore, in the stretchable display device 1000' according to another aspect of the present disclosure, the second rigid substrate 842 is disposed on the first bonding area BA1 where the display panel 100 is bonded. Thus, even if the flexible printed circuit film 800 is formed of a ductile material, the display panel 100 and the flexible printed circuit film 800 can be bonded to each other under the conventional processing conditions.

The fourth rigid substrate 844 serves to support the base film 810 since the base film 810 is formed of a ductile material and the bonding process is performed under high thermal pressure. The fourth rigid substrate 844 may be bonded to the base film 810 with an adhesive. The width of the fourth rigid substrate 844 may be equal to or smaller than that of the second rigid substrate 842. The fourth rigid substrate 844 is not an essential component and may be eliminated as necessary.

The first anisotropy conductive film 910 is disposed between the island substrate 112 of the display panel 100 and the base film 810 of the flexible printed circuit film 800. More specifically, as shown in FIG. 10 and FIG. 11A, the first anisotropy conductive film 910 may be disposed to cover the bottom and lateral surfaces of the fourth rigid substrate 844 disposed on the bottom surface of the base film 810, and the lateral surface of the base film 810. That is, the first anisotropy conductive film 910 may have an "L" shape. The plurality of conductive connection lines 832 disposed on the top surface of the base film 810 may be in contact with a top surface of the first anisotropy conductive film 910. Therefore, the island substrate 112 of the display panel 100 may be electrically connected to the plurality of conductive connection lines 832 disposed on the top surface of the base film 810 of the flexible printed circuit film 800.

In FIG. 10 and FIG. 11A, the first anisotropy conductive film 910 has the "L" shape in order for the plurality of conductive connection lines 832 disposed on the base film 810 to be electrically connected to the display panel 100. However, the present disclosure is not limited thereto.

Referring to FIG. 11B, a first anisotropy conductive film 910' is disposed on the island substrate 112 of the display panel 100 and a first contact hole CT1 is formed in the fourth rigid substrate 844' and the base film 810. Thus, the first anisotropy conductive film 910' may be electrically connected to the plurality of conductive connection lines 832 disposed on the top surface of the base film 810 through the first contact hole CT1.

As described above, in the stretchable display device 1000' according to another aspect of the present disclosure, the flexible printed circuit film 800 is formed of a stretchable material. Thus, when the display panel 100 is stretched, the flexible printed circuit film 800 can be stretched corresponding to stretching of the display panel 100.

Further, in the stretchable display device 1000' according to another aspect of the present disclosure, the second rigid substrate 842 and the fourth rigid substrate 844 are disposed where the display panel 100 is bonded on the base film 810 of the flexible printed circuit film 800. Thus, the display panel 100 and the flexible printed circuit film 800 can be bonded to each other under the conventional processing conditions.

Furthermore, in the stretchable display device 1000' according to another aspect of the present disclosure, the driving circuit chip 820 is disposed on the base film 810. The first rigid substrate 841 having a higher rigidity than the base film 810 is further disposed between the base film 810 and the driving circuit chip 820. Thus, when the flexible printed circuit film 800 is stretched, damage to the driving circuit chip 820 disposed on the base film 810 can be minimized.

The second bonding area BA2 is an area where the printed circuit board 300 is bonded. Referring to FIG. 9, in the second bonding area BA2, a second anisotropy conductive film 920 for electrically connecting the printed circuit board 300 and the flexible printed circuit film 800 and the flexible printed circuit film 800 are disposed.

Referring to FIG. 10 and FIG. 11A, in the second bonding area BA2, a third rigid substrate 843 on the top surface of the base film 810 and a fifth rigid substrate 845 on the bottom surface of the base film 810 may be disposed. A bottom surface of the fifth rigid substrate 845, a lateral surface of the fifth rigid substrate 845, and the lateral surface of the base film 810 may be in contact with the second anisotropy conductive film 920.

Referring to FIG. 10 and FIG. 11A, the third rigid substrate 843 may be disposed on the top surface of the base film 810. The third rigid substrate 843 may be provided such that the printed circuit board 300 and the flexible printed circuit film 800 can be bonded under the conventional processing conditions. The third rigid substrate 843 may be bonded to the base film 810 with an adhesive.

In a typical display device, a printed circuit board and a flexible printed circuit film are bonded to each other by placing an anisotropy conductive film on the printed circuit board and placing the flexible printed circuit film on the anisotropy conductive film, followed by thermal pressing. In this case, the thermal pressing is performed at a temperature of up to 240° C. As described in another aspect of the present disclosure, if the flexible printed circuit film 800 is formed of a ductile material, it can be easily damaged at high temperature due to the properties of the ductile material. Thus, the bonding process cannot be performed under the conventional processing conditions.

Therefore, in the stretchable display device 1000' according to another aspect of the present disclosure, the third rigid substrate 843 is disposed on the second bonding area BA2 where the printed circuit board 300 is bonded. Thus, even if the flexible printed circuit film 800 is formed of a ductile material, the printed circuit board 300 and the flexible printed circuit film 800 can be bonded to each other under the conventional processing conditions.

The fifth rigid substrate 845 serves to support the base film 810 since the base film 810 is formed of a ductile material and the bonding process is performed under high thermal pressure. The fifth rigid substrate 845 may be bonded to the base film 810 with an adhesive. The width of the fifth rigid substrate 845 may be equal to or smaller than that of the third rigid substrate 843. The fifth rigid substrate 845 is not an essential component and may be eliminated as necessary.

The second anisotropy conductive film 920 is disposed between the printed circuit board 300 and the base film 810 of the flexible printed circuit film 800. More specifically, as shown in FIG. 10 and FIG. 11A, the second anisotropy conductive film 920 may be disposed to cover the bottom and lateral surfaces of the fifth rigid substrate 845 disposed on the bottom surface of the base film 810, and the lateral surface of the base film 810. That is, the second anisotropy conductive film 920 may have an "L" shape. The plurality of conductive connection lines 832 disposed on the top surface of the base film 810 may be in contact with atop surface of the second anisotropy conductive film 920. Therefore, the printed circuit board 300 may be electrically connected to the plurality of conductive connection lines 832 disposed on the top surface of the base film 810 of the flexible printed circuit film 800.

In FIG. 10 and FIG. 11A, the second anisotropy conductive film 920 has the "L" shape in order for the plurality of conductive connection lines 832 disposed on the base film 810 to be electrically connected to the printed circuit board 300. However, the present disclosure is not limited thereto.

Referring to FIG. 11B, a second anisotropy conductive film 920' is disposed on the printed circuit board 300 and a second contact hole CT2 is formed in the fifth rigid substrate 845' and the base film 810. Thus, the second anisotropy conductive film 920' may be electrically connected to the plurality of conductive connection lines 832 disposed on the top surface of the base film 810 through the second contact hole CT2.

As described above, in the stretchable display device 1000' according to another aspect of the present disclosure, the third rigid substrate 843 and the fifth rigid substrate 845 are disposed where the printed circuit board 300 is bonded on the base film 810 of the flexible printed circuit film 800. Thus, the printed circuit board 300 and the flexible printed circuit film 800 can be bonded to each other under the conventional processing conditions.

Figure 12A:
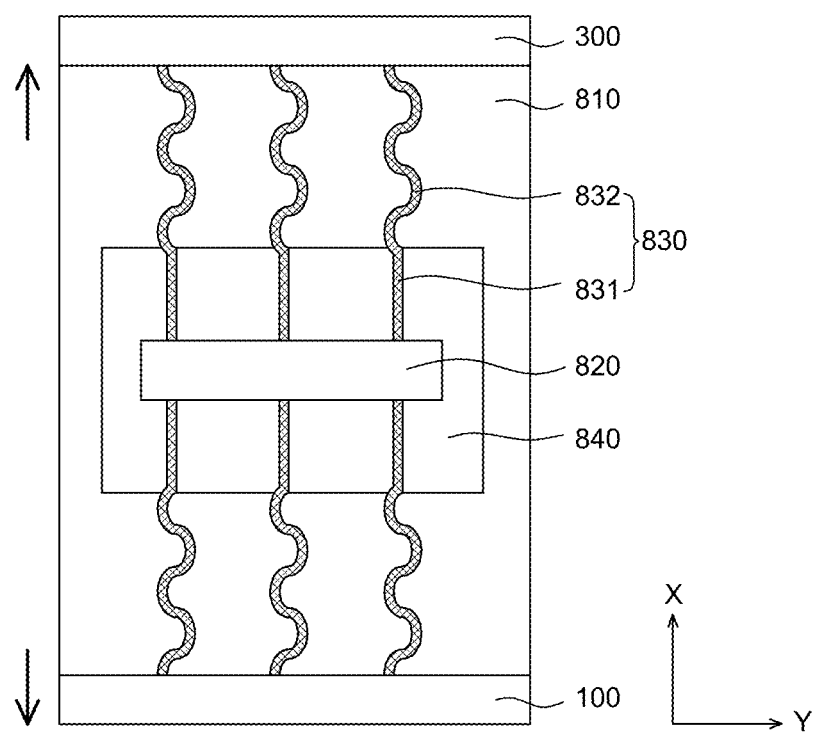
FIG. 12A and FIG. 12B are plan views illustrating examples when a stretchable display device according to another aspect of the present disclosure is stretched.
Figure 12B:
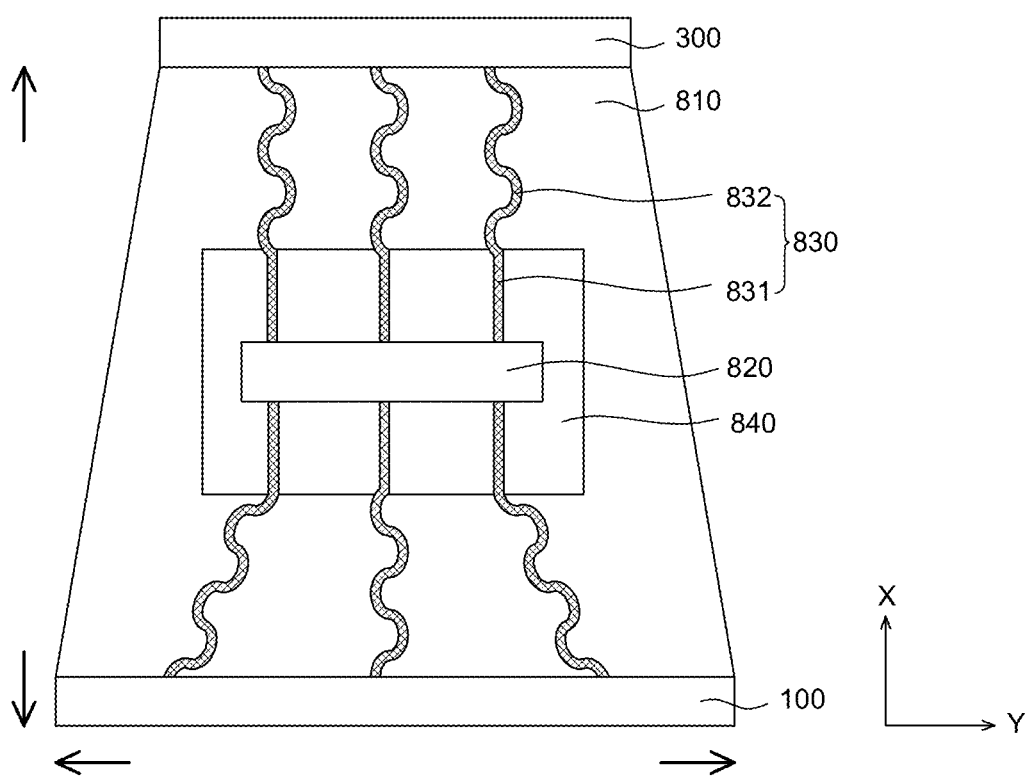

FIG. 12A and FIG. 12B are plan views illustrating examples where a stretchable display device according to another aspect of the present disclosure is stretched.

FIG. 12A illustrates an example where the stretchable display device 1000' according to another aspect of the present disclosure is stretched in the X-axis direction. As shown in FIG. 12A, when the display panel 100 is stretched in the X-axis direction, the flexible printed circuit film 800 can also be stretched in the X-axis direction corresponding to stretching of the display panel 100.

FIG. 12B illustrates an example where the stretchable display device 1000' according to another aspect of the present disclosure is stretched in the X-axis and Y-axis directions. As shown in FIG. 12B, when the display panel 100 is stretched in the X-axis and Y-axis directions, the flexible printed circuit film 800 can also be stretched in the X-axis and Y-axis directions corresponding to stretching of the display panel 100.

Therefore, the stretchable display device 1000' according to another aspect of the present disclosure can minimize stress of the flexible printed circuit film 800 caused by stretching of the display panel 100.

Figure 13:
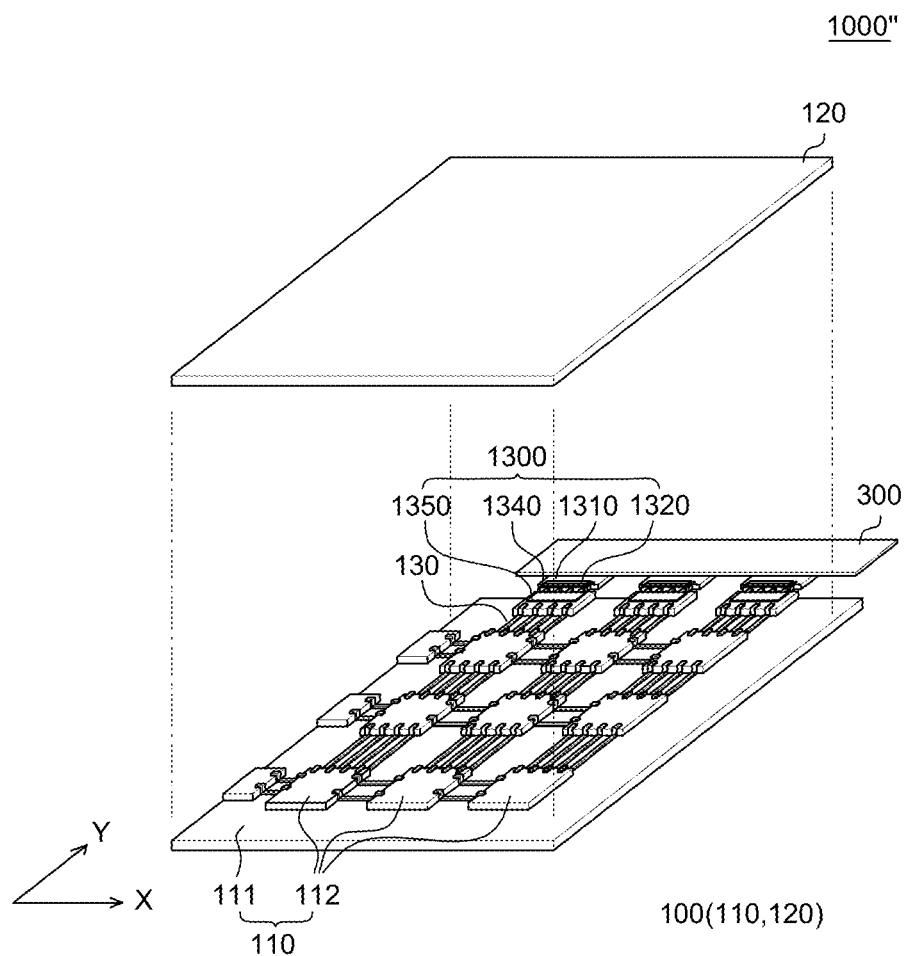
FIG. 13 is a schematic exploded perspective view of a stretchable display device according to yet another aspect of the present disclosure.

FIG. 13 is a schematic exploded perspective view of a stretchable display device according to yet another aspect of the present disclosure.

Referring to FIG. 13, a stretchable display device 1000" according to yet another aspect of the present disclosure includes the display panel 100, a flexible printed circuit film 1300, and the printed circuit board 300. The stretchable display device 1000" according to yet another aspect of the present disclosure is substantially the same as the stretchable display device 1000 shown in FIG. 1A and FIG. 1B except the structure of a flexible printed circuit film. Therefore, redundant description of the same components will not be provided.

In the stretchable display device 1000" according to yet another aspect of the present disclosure, the flexible printed circuit film 1300 may include a base film 1310 and a driving circuit chip 1320 disposed on the base film 1310. The flexible printed circuit film 1300 may also include a plurality of conductive lines (not illustrated) for transferring a signal input from the outside to at least one of a top surface and a bottom surface of the base film 1310. The flexible printed circuit film 1300 may further include a plurality of rigid substrates 1340 and 1350 disposed on at least one of the top surface and the bottom surface of the base film 1310. As will be described below, FIG. 13 illustrates only a first rigid substrate 1340 for suppressing damage to the driving circuit chip 1320 of the flexible printed circuit film 1300 and a second rigid substrate 1350 for bonding to the display panel 100, among the plurality of rigid substrates 1340 and 1350. However, as described above with reference to FIG. 9 through FIG. 11B, the flexible printed circuit film 1300 may further include a lower rigid substrate disposed under the base film 1310 for bonding to the display panel 100 and upper and lower rigid substrates for bonding to the printed circuit board 300.

The base film 1310 serves to support the driving circuit chip 1320. The base film 1310 may be formed of the same material as the lower substrate 111 of the first substrate 110 in the display panel 100. The base film 1310 may be formed as a ductile film of an insulating material which can be bent or stretched. For example, the base film 1310 may be formed of silicone rubber such as PDMS or an elastomer such as PU. However, the materials of the base film 1310 are not limited thereto. Accordingly, the base film 1310 is stretchable in at least one of an X-axis direction which is a first direction and a second direction perpendicular to the X-axis direction, i.e., Y-axis direction.

The base film 1310 is a ductile film and can be reversibly expanded and contracted. Further, the base film 1310 may have an elastic modulus ranging from several MPa to several hundreds of MPa and may have a stretch failure of 100% or more.

The base film 1310 may be disposed as separated from each other in order for a part of the base film 1310, more specifically, a part adjacent to the display panel 100 with respect to the driving circuit chip 1320, to more easily respond to the extensible display panel 100. To be more specific, the base film 1310 of the flexible printed circuit film 1300 may be disposed as separated into sub-base films respectively corresponding to the plurality of conductive lines disposed on the base film 1310 according to a stretch rate of the display panel 100.

On the top surface of the base film 1310, a plurality of conductive lines (not illustrated) is disposed. The plurality of conductive lines serves to receive an image data signal and a drive data signal from the printed circuit board 300 and transfer the signals to the driving circuit chip 1320. Also, the plurality of conductive lines transfers a gate control signal and a data control signal generated by the driving circuit chip 1320 to the display panel 100.

The plurality of rigid substrates 1340 and 1350 may be disposed on at least one of the top surface and the bottom surface of the base film 1310. More specifically, the plurality of rigid substrates may include a first rigid substrate 1340 disposed under the driving circuit chip 1320 and on the top surface of the base film 1310 of the flexible printed circuit film 1300. The plurality of rigid substrates may also include a second rigid substrate 1350 disposed where the display panel 100 is bonded. Therefore, even if the base film 1310 of the flexible printed circuit film 1300 is formed of a ductile material, damage to the driving circuit chip 1320 caused by stretching can be minimized. Further, the bonding process can be performed under the conventional processing conditions.

The first and second rigid substrates 1340 and 1350 may be more rigid than the base film 1310. That is, the base film 1310 may be more ductile than the first and second rigid substrates 1340 and 1350 and the first and second rigid substrates 1340 and 1350 may be more rigid than the base film 1310.

The first and second rigid substrates 1340 and 1350 may be formed of a plastic material having flexibility and may be formed of, e.g., PI. The first and second rigid substrates 1340 and 1350 may have a higher modulus than the base film 1310. Herein, the modulus refers to an elastic modulus that is the ratio of the stress applied to a substrate to the change caused by the stress. If the modulus is relatively high, the rigidity may be relatively high. Therefore, the first and second rigid substrates 1340 and 1350 may be rigid relative to the base film 1310. The modulus of the first and second rigid substrates 1340 and 1350 may be 1000 times or more than that of the base film 1310, but is not limited thereto.

A plurality of conductive lines may be disposed on the base film 1310. Each of the plurality of conductive lines may be disposed between the plurality of rigid substrates 1340. That is, the plurality of conductive lines may be disposed on the base film 1310. The plurality of conductive lines may include a plurality of conductive signal lines disposed on the plurality of rigid substrates 1340 and a plurality of conductive connection lines disposed on the base film 1310 formed of a ductile material.

The driving circuit chip 1320 is disposed on the rigid substrate 1340 in a central region of the base film 1310. The driving circuit chip 1320 processes data for displaying an image input from the outside and a drive signal for processing the data. FIG. 13 illustrates that the driving circuit chip 1320 is mounted by a chip on film (COF) method, but is not limited thereto. The driving circuit chip 1320 may also be mounted by a chip on glass (COG) method or a tape carrier package (TCP) method.

In the stretchable display device 1000″ according to yet another aspect of the present disclosure, the base film 1310 of the flexible printed circuit film 1300 is formed of a ductile material. Also, the base film 1310 is disposed as separated into a plurality of sub-base films according to a stretch rate of the display panel 100. Therefore, the stretchable display device 1000″ according to yet another aspect of the present disclosure can more effectively respond to stretching of the display panel 100.

Figure 14:
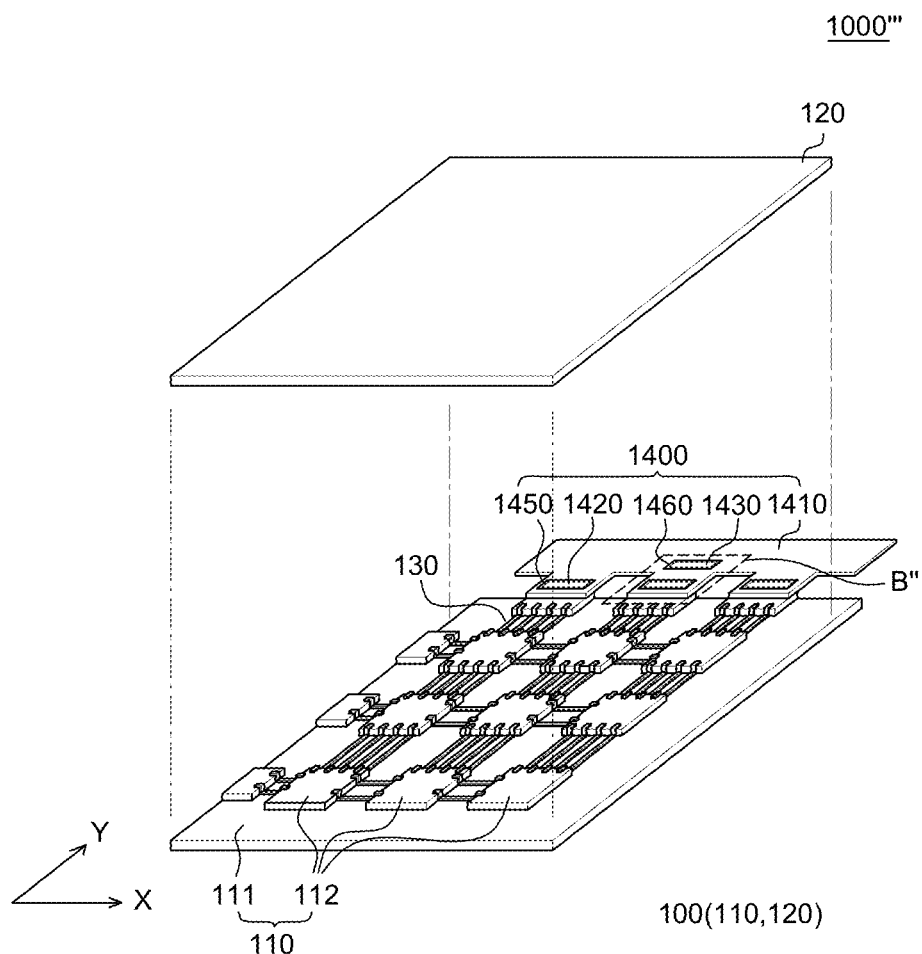
FIG. 14 is a schematic exploded perspective view of a stretchable display device according to still another aspect of the present disclosure.
Figure 15:
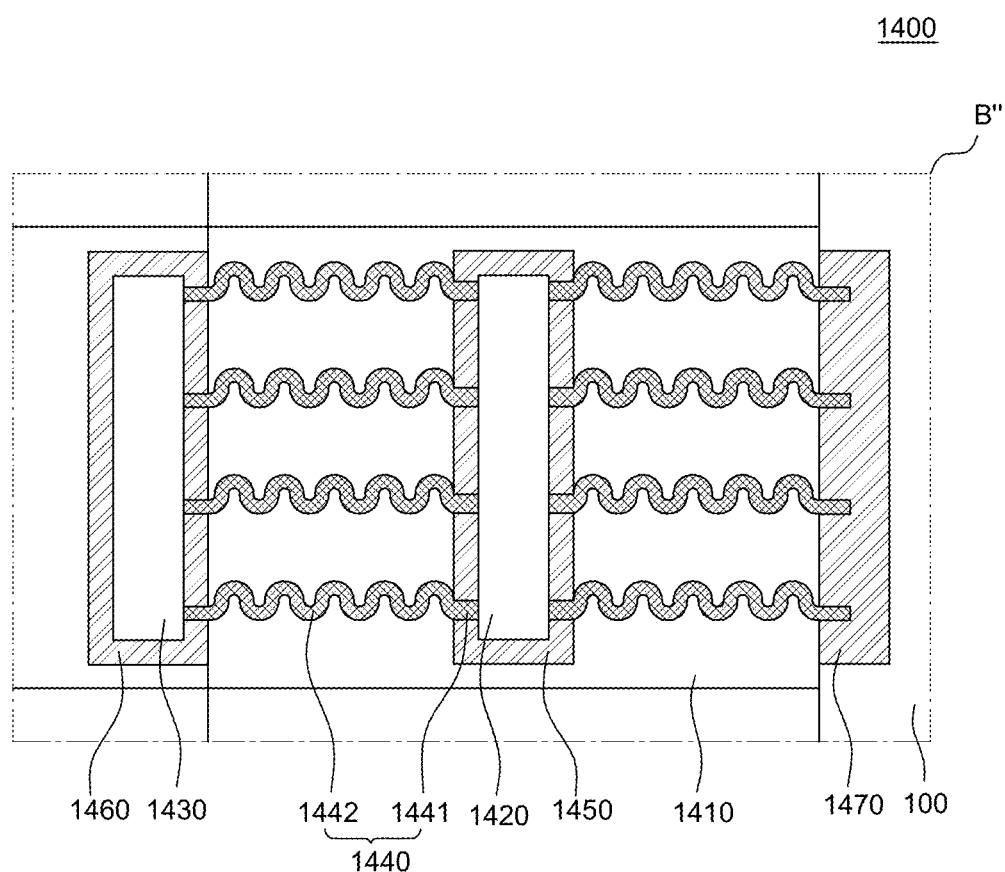
FIG. 15 is an enlarged plan view illustrating a region "B''" of FIG. 14.

FIG. 14 is a schematic exploded perspective view of a stretchable display device according to still another aspect of the present disclosure. FIG. 15 is an enlarged plan view illustrating a region "B″″" of FIG. 14.

Referring to FIG. 14 and FIG. 15, a stretchable display device 1000‴ according to still another aspect of the present disclosure includes the display panel 100 and a flexible printed circuit film 1400. The stretchable display device 1000‴ according to still another aspect of the present disclosure is different from the stretchable display device 1000 shown in FIG. 1A and FIG. 1B except the structure of the display panel 100. Therefore, redundant description of substantially the same component, i.e., the detailed structure of the display panel 100, will not be provided.

In the stretchable display device 1000‴ according to still another aspect of the present disclosure, the flexible printed circuit film 1400 may include a base film 1410 and a first driving circuit chip 1420 disposed on the base film 1410. The flexible printed circuit film 1400 may also include a second driving circuit chip 1430 spaced apart from the first driving circuit chip 1420. The flexible printed circuit film 1400 may further include a plurality of conductive lines 1440 disposed on at least one of a top surface and a bottom surface of the base film 1410. The plurality of conductive lines 1440 electrically connects the first driving circuit chip 1420 to the second driving circuit chip 1430 and the first driving circuit chip 1420 to the display panel 100. The flexible printed circuit film 1400 may also include a plurality of rigid substrates 1450, 1460, and 1470 disposed on at least one of the top surface and the bottom surface of the base film 1410. As will be described below, FIG. 14 and FIG. 15 illustrate only a first rigid substrate 1450 for suppressing damage to the first driving circuit chip 1420 of the flexible printed circuit film 1400, a second rigid substrate 1460 for suppressing damage to the second driving circuit chip 1430, and a third rigid substrate 1470 for bonding to the display panel 100 among the plurality of rigid substrates 1450, 1460, and 1470. However, the flexible printed circuit film 1400 may further include a lower rigid substrate disposed under the base film 1410 for bonding to the display panel 100.

The base film 1410 serves to support the first driving circuit chip 1420 and the second driving circuit chip 1430. The base film 1410 may be formed of the same material as the lower substrate 111 of the first substrate 110 in the display panel 100. The base film 1410 may be formed as a ductile film of an insulating material which can be bent or stretched. For example, the base film 1410 may be formed of silicone rubber such as PDMS or an elastomer such as PU. However, the materials of the base film 1410 are not limited thereto. Accordingly, the base film 1410 is stretchable in at least one of an X-axis direction which is a first direction and a second direction perpendicular to the X-axis direction, i.e., Y-axis direction.

The base film 1410 is a ductile film and can be reversibly expanded and contracted. Further, the base film 1410 may have an elastic modulus ranging from several MPa to several hundreds of MPa and may have a stretch failure of 100% or more.

The plurality of rigid substrates 1450, 1460, and 1470 may be disposed on at least one of the top surface and the bottom surface of the base film 1410. The plurality of rigid substrates 1450, 1460 and 1470 may be formed of a plastic material having flexibility and may be formed of, e.g., PI.

The plurality of rigid substrates 1450, 1460, and 1470 may have a higher modulus than the base film 1410. Herein, the modulus refers to an elastic modulus that is the ratio of the stress applied to a substrate to the change caused by the stress. If the modulus is relatively high, the rigidity may be relatively high. Therefore, the plurality of rigid substrates 1450, 1460, and 1470 may be rigid relative to the base film 1410. The modulus of the plurality of rigid substrates 1450, 1460, and 1470 may be 1000 times or more than that of the base film 1410 but is not limited thereto.

The plurality of rigid substrates 1450, 1460, and 1470 may include the first rigid substrate 1450 disposed where the first driving circuit chip 1420 of the flexible printed circuit film 1400 is disposed. The plurality of rigid substrates 1450, 1460, and 1470 may also include the second rigid substrate 1460 disposed where the second driving circuit chip 1430 is disposed. The plurality of rigid substrates 1450, 1460, and 1470 may further include the third rigid substrate 1470 disposed where the display panel 100 is bonded.

On the first rigid substrate 1450, the first driving circuit chip 1420 and a plurality of conductive signal lines 1441 may be disposed. The first rigid substrate 1450 may have a greater width than the first driving circuit chip 1420. However, the first rigid substrate 1450 may have a smaller width than the base film 1410.

On the second rigid substrate 1460, the second driving circuit chip 1430 and the plurality of conductive signal lines 1441 may be disposed. The second rigid substrate 1460 may have a greater width than the second driving circuit chip 1430. However, the second rigid substrate 1460 may have a smaller width than the base film 1410.

The third rigid substrate 1470 may be disposed where the display panel 100 is bonded on the base film 1410. Although not illustrated in the drawings, a rigid substrate may be further disposed where the display panel 100 is bonded on the bottom surface of the base film 1410. Further, although not illustrated in the drawings, an anisotropy conductive film for electrically connecting the display panel 100 and the flexible printed circuit film 1400 may be disposed where the display panel 100 is bonded. The third rigid substrate 1470 may be provided such that the display panel 100 and the flexible printed circuit film 1400 can be bonded to each other under the conventional processing conditions.

The plurality of conductive lines 1440 may be disposed on the base film 1410. Each of the plurality of conductive lines 1440 may be disposed on and between the plurality of rigid substrates 1450, 1460, and 1470. The plurality of conductive lines 1440 may include the plurality of conductive signal lines 1441 disposed on the plurality of rigid substrates 1450, 1460, and 1470. The plurality of conductive lines 1440 may also include a plurality of conductive connection lines 1442 disposed on the base film 1410 formed of a ductile material.

The plurality of conductive signal lines 1441 may be disposed on the first rigid substrate 1450 and the second rigid substrate 1460 and may be formed into straight lines. The plurality of conductive signal lines 1441 may be electrically connected to the plurality of conductive connection lines 1442 disposed on the base film 1410.

The plurality of conductive connection lines 1442 is electrically connected to the plurality of conductive signal lines 1441 disposed on top surfaces of the first rigid substrate 1450 and the second rigid substrate 1460. Thus, the plurality of conductive connection lines 1442 can transfer signals output from the first driving circuit chip 1420 and the second driving circuit chip 1430 to the first driving circuit chip 1420 and the display panel 100, respectively. The plurality of conductive connection lines 1442 may be disposed in a wave shape to minimize the occurrence of cracks in the lines when the base film 1410 is stretched. In the present aspect, the plurality of conductive connection lines 1442 is illustrated as disposed in a wave shape but is not limited thereto. The plurality of conductive connection lines 1442 may be disposed in any shape such as a diamond shape capable of minimizing the occurrence of cracks in the lines.

The plurality of conductive connection lines 1442 may be formed of a conductive metal material or may be formed of the same material as connection lines disposed on the display panel 100.

The plurality of conductive signal lines 1441 on the first rigid substrate 1450 and the second rigid substrate 1460 may be electrically connected to the plurality of conductive connection lines 1442 disposed on the base film 1410. Herein, the plurality of conductive signal lines 1441 and the plurality of conductive connection lines 1442 may be electrically connected through signal pads which are not illustrated. The signal pads are provided on the first rigid substrate 1450 and the second rigid substrate 1460. However, electrical connection between the plurality of conductive signal lines 1441 on the first rigid substrate 1450 and the second rigid substrate 1460 and the plurality of conductive connection lines 1442 on the base film 1410 is not limited thereto. The plurality of conductive signal lines 1441 and the plurality of conductive connection lines 1442 may be electrically connected by coating a metal material on connection portions between the conductive signal lines 1441 and the conductive connection lines 1442 by inkjet printing. Otherwise, the plurality of conductive signal lines 1441 and the plurality of conductive connection lines 1442 may be electrically connected through contact holes formed in the first rigid substrate 1450 and the second rigid substrate 1460. The plurality of conductive signal lines 1441 and conductive connection lines 1442 may be formed of conductive metal materials or may be formed of the same material as connection lines disposed on the display panel 100. As described above, the flexible printed circuit film 1400 of the stretchable display device 1000''' according to still another aspect of the present disclosure is formed of a ductile material. Further, the first rigid substrate 1450 is disposed where the first driving circuit chip 1420 is disposed and the second rigid substrate 1460 is disposed where the second driving circuit chip 1430 is disposed. Therefore, damage to the first and second driving circuit chips 1420 and 1430 caused by stretching can be suppressed.

The first driving circuit chip 1420 may receive an image data control signal or the like from the second driving circuit chip 1430 and generate drive control signals, i.e., a gate control signal and a data control signal, which can be applied to the display panel 100. Then, the first driving circuit chip 1420 may output the drive control signals to the display panel 100. The first driving circuit chip 1420 is disposed on the first rigid substrate 1450 close to the display panel 100. That is, the first driving circuit chip 1420 is disposed in a region of the base film 1410 which is adjacent to the display panel 100. The first driving circuit chip 1420 may have the same configuration as disposed in a conventional connection film for connecting a display panel and a printed circuit board, and may be, e.g., a gate driving circuit, a data driving circuit, or the like.

The second driving circuit chip 1430 may receive image data input from the outside, generate an image data control signal or the like, and output the signal to the first driving circuit chip 1420. The second driving circuit chip 1430 is disposed on the second rigid substrate 1460 which is disposed farther from the display panel 100 than the first rigid substrate 1450. That is, the second driving circuit chip 1430 is disposed in a region of the base film 1410 which is far from the display panel 100. The second driving circuit chip 1430 may have the same configuration as a conventional main driving chip disposed in a printed circuit board, and may be, e.g., a timing controller.

In the stretchable display device 1000''' according to still another aspect of the present disclosure, the first driving circuit chip 1420 is disposed on the base film 1410 of the flexible printed circuit film 1400 formed of a ductile material which can be extensible in the first and second directions. In addition to the first driving circuit chip 1420, the second driving circuit chip 1430, which may be a main driving chip, e.g., a timing controller, conventionally disposed in a printed circuit board, is also disposed. A fraction defective of a stretchable display device can be reduced by reducing tensile stress, compared to a conventional one using a different material from the display panel 100.

Further, in the stretchable display device 1000''' according to still another aspect of the present disclosure, the plurality of rigid substrates 1450, 1460, and 1470 is disposed where the display panel 100 is bonded and where the first and second driving circuit chips 1420 and 1430 are disposed, respectively. Thus, even if the flexible printed circuit film 1400 is formed of a ductile material, the flexible printed circuit film 1400 can be bonded to the display panel 100 under the conventional processing conditions. Also, damage to the first and second driving circuit chips 1420 and 1430 caused by stretching can be suppressed. A flexible printed circuit film according to various aspects of the present disclosure and a stretchable display device including the same can be described as follows.

The exemplary aspects of the present disclosure can also be described as follows:

According to an aspect of the present disclosure, a flexible printed circuit film includes a base film and a plurality of conductive lines disposed on at least one surface of the base film. The base film is separated into a plurality of films corresponding to the plurality of conductive lines, respectively.

The flexible printed circuit film may further comprise a driving circuit chip disposed on the base film The base film may include a first film area disposed on one side of the driving circuit chip and a second film area disposed on the other side of the driving circuit chip, with respect to the driving circuit chip, and the base film may be separated into a plurality of sub-base films corresponding to the plurality of conductive lines disposed in the first film area.

The first film area of the base film may be adjacent to a stretchable module.

The plurality of conductive lines disposed in the first film area may have any one of a straight-line shape, a wave shape, and a diamond shape.

The base film may be made of a material having flexibility.

According to another aspect of the present disclosure, a stretchable display device includes a display panel in which a plurality of emission elements is disposed on a stretchable substrate and a printed circuit board that receives image data from the outside and transfers the image data to the display panel. The stretchable display device also includes a connection film in which a plurality of conductive lines electrically connecting the display panel and the printed circuit board is disposed. The connection film further includes a plurality of sub-base films which is disposed to separate the plurality of conductive lines according to a stretch rate of the display panel.

When the display panel is stretched, the distance between the plurality of sub-base films in the connection film may increase as being closer to the display panel.

The connection film is made of any one of polyimide-based resin and epoxy-based resin.

The connection film may further include a driving circuit chip disposed on the base film, and the connection film includes a first film area adjacent to the display panel and a second film area adjacent to the printed circuit board with respect to the driving circuit chip.

The plurality of sub-base films may be disposed in the first film area.

The display panel may include a lower substrate made of a ductile material and a plurality of island substrates which is made of a rigid material relative to the lower substrate and on which the plurality of emission elements is disposed, and the plurality of island substrates may be disposed to space apart from each other on the lower substrate.

Connection lines electrically connecting the plurality of island substrates may be further disposed on the lower substrate.

The plurality of conductive lines disposed in the first film area has a shape corresponding to the connection lines disposed on the display panel.

According to yet another aspect of the present disclosure, a flexible printed circuit film is provided. The flexible printed circuit film includes a base film which is stretchable in at least one of a first direction and a second direction perpendicular to the first direction. The flexible printed circuit film also includes a plurality of rigid substrates disposed on at least one of a top surface or a bottom surface of the base film. The flexible printed circuit film further includes a driving circuit chip disposed on any one of the plurality of rigid substrates and a plurality of conductive lines that transfers data input from the outside.

The plurality of conductive lines may be disposed in a wave shape or a diamond shape.

The plurality of rigid substrates may be made of a material having flexibility.

The base film may include a first film area including a plurality of sub-base films separated corresponding to the plurality of conductive lines, respectively, and a second film area in which the plurality of conductive lines is disposed.

At least one of the plurality of rigid substrates may be placed between the first film area and the second film area.

According to still another aspect of the present disclosure, a stretchable display device includes a display panel in which a plurality of emission elements is disposed on a substrate which is stretchable in at least one of a first direction and a second direction perpendicular to the first direction. The stretchable display device also includes a printed circuit board that receives image data from the outside and transfers the image data to the display panel. The stretchable display device further includes a connection film electrically connecting the display panel and the printed circuit board. The connection film is stretchable in at least one of the first direction and the second direction according to a stretch direction of the display panel.

The connection film may include a base film made of a stretchable material, a driving circuit chip which is disposed on the base film and converts the image data transferred from the printed circuit board and drive data into a data signal and a drive control signal and transfers the signals to the display panel; and a plurality of conductive lines electrically connecting the display panel, the driving circuit chip, and the printed circuit board.

The base film may include a first region where the display panel is bonded, a second region including a region where the driving circuit chip is disposed, and a third region where the printed circuit board is bonded, and a rigid substrate may be further disposed on each of at least one of a top surface and a bottom surface of the base film corresponding to the first region, the second region, and the third region.

The rigid substrate may be made of any one of polyimide-based resin and epoxy-based resin.

The base film may be made of any one of silicone rubber, urethane rubber, and acryl.

The display panel may include a plurality of island substrates disposed to spaced apart from each other corresponding to the plurality of emission elements spaced apart from each other, and a ductile substrate which is disposed under the plurality of island substrates and on which connection lines electrically connecting the emission elements are placed.

The connection lines may have any one of a wave shape and a diamond shape.

The plurality of conductive lines disposed on the connection film may have a shape corresponding to the connection lines.

The base film in the second region may include a region including a plurality of sub-base films separated corresponding to the plurality of conductive lines, respectively.

According to still another aspect of the present disclosure, a display panel in which a plurality of emission elements is disposed on a substrate which is stretchable in at least one of a first direction and a second direction perpendicular to the first direction; and a printed circuit film including a first driving circuit chip that generates a drive control signal to be applied to the display panel and a second driving circuit chip that receives image data from the outside and transfers the image data to the first driving circuit chip, wherein the printed circuit film is stretchable in at least one of the first direction and the second direction according to a stretch direction of the display panel.

The printed circuit film may include abase film made of a stretchable material, a plurality of conductive lines electrically connecting the display panel to the first driving circuit chip and the first driving circuit chip to the second driving circuit chip on the base film, a first rigid substrate placed between the base film and the first driving circuit chip, a second rigid substrate placed between the base film and the second driving circuit chip and A third rigid substrate placed where the display panel is bonded to the printed circuit film.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed with respect to the following claims, and all the technical concepts in the equivalent scope thereof should be construed as falling within the scope of the present disclosure.

What is claimed is:

1. A flexible printed circuit film, comprising:
  a base film which is stretchable in a first direction and a second direction perpendicular to the first direction, and including a plurality of sub-base films separated from one another; and
  a plurality of conductive lines disposed on the base film,
  wherein each of the plurality of sub-base films is disposed to correspond to each of the plurality of conductive lines,
  wherein the base film includes one side in the second direction and another side opposite the one side in the second direction,
  wherein the plurality of sub-base films are disposed to be spaced apart along the first direction, and
  wherein, when the base film is stretched, a distance between the plurality of sub-base films along the first direction increases in the second direction from the one side of the base film to the another side of the base film.

2. The flexible printed circuit film according to claim 1, further comprising a driving circuit chip disposed on the base film,
  wherein the driving circuit chip is configured to output a drive control signal to a stretchable module including a display panel through the plurality of conductive lines.

3. The flexible printed circuit film according to claim 2, wherein the base film is adjacent to the stretchable module.

4. The flexible printed circuit film according to claim 2, wherein the plurality of conductive lines disposed in the base film has one of a straight-line shape, a wave shape, and a diamond shape.

5. A flexible printed circuit film, comprising:
  a first base film which is stretchable in at least one of a first direction and a second direction perpendicular to the first direction, and including a plurality of sub-base films separated from one another;
  a plurality of rigid substrates disposed on at least one of a top surface or a bottom surface of the first base film;
  a second base film adjacent to the first base film;
  a driving circuit chip disposed on one of the plurality of rigid substrates and having one side connected to the first base film and another side connected to the second base film;
  a plurality of first conductive lines each disposed to correspond to each of the plurality of sub-base films; and
  a plurality of second conductive lines disposed on the second base film and transferring data input from outside.

6. The flexible printed circuit film according to claim 5, wherein the plurality of conductive lines has a wave shape or a diamond shape.

7. The flexible printed circuit film according to claim 5, wherein the plurality of rigid substrates is stretchable.

8. The flexible printed circuit film according to claim 7, further comprising a printed circuit board connected to the second base film.

9. The flexible printed circuit film according to claim 8, wherein at least one of the plurality of rigid substrates is disposed between the first base film and the second base film.

10. The flexible printed circuit film according to claim 1, wherein the plurality of sub-base films are stretchable in the first direction and the second direction.

11. The flexible printed circuit film according to the claim 5, wherein the plurality of sub-base films are stretchable in the first direction and the second direction.

* * * * *